(12) United States Patent
Nikkhoo et al.

(10) Patent No.: US 12,032,171 B1
(45) Date of Patent: Jul. 9, 2024

(54) THERMAL HINGE SYSTEM

(71) Applicant: Meta Platforms Technologies, LLC

(72) Inventors: Michael Nikkhoo, Saratoga, CA (US);
Hunter Cantrell, Vancouver, WA (US);
Brian Toleno, Cupertino, CA (US);
Shobhit Verma, Sammamish, WA (US);
Igor Markovsky, Campbell, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/745,633

(22) Filed: May 16, 2022

Related U.S. Application Data

(60) Provisional application No. 63/306,930, filed on Feb. 4, 2022, provisional application No. 63/306,949, filed on Feb. 4, 2022.

(51) Int. Cl.
| | | |
|---|---|---|
| *G02B 27/01* | (2006.01) | |
| *G06F 1/16* | (2006.01) | |
| *G06F 1/20* | (2006.01) | |
| *H05K 7/20* | (2006.01) | |

(52) U.S. Cl.
CPC ......... *G02B 27/0176* (2013.01); *G06F 1/163* (2013.01); *G06F 1/1681* (2013.01); *G06F 1/203* (2013.01); *H05K 7/20436* (2013.01)

(58) Field of Classification Search
CPC ... G02B 27/0176; G06F 1/163; G06F 1/1681; G06F 1/203; H05K 7/20436
See application file for complete search history.

(56) References Cited

U.S. PATENT DOCUMENTS

| | | | | |
|---|---|---|---|---|
| 5,646,822 A | * | 7/1997 | Bhatia ..................... | F28D 15/02 361/679.52 |
| 5,796,581 A | * | 8/1998 | Mok ....................... | G06F 1/203 361/679.52 |
| 6,052,280 A | * | 4/2000 | Dilley ..................... | G06F 1/203 174/15.2 |
| 6,075,696 A | * | 6/2000 | Progl ...................... | G06F 1/203 361/679.52 |
| 6,097,596 A | * | 8/2000 | Cipolla ................... | G06F 1/203 361/679.55 |

(Continued)

FOREIGN PATENT DOCUMENTS

JP      WO2023013180 A1      2/2023

OTHER PUBLICATIONS

International Search Report and Written Opinion for International Application No. PCT/US2023/012356, mailed May 22, 2023, 11 pages.

(Continued)

*Primary Examiner* — Michael A Matey
(74) *Attorney, Agent, or Firm* — Morgan, Lewis & Bockius LLP

(57) ABSTRACT

A method and system to conduct thermal energy between two hinged portions of an electric device. In examples, the method employs a thermal hinge system configured to transfer or spread thermal energy, and optionally electrical energy, through a mechanical articulation or hinge in an electronic device. A thermal hinge may include a thermally conductive living hinge, complementary and/or mating thermal interface components, or a combination of both.

20 Claims, 13 Drawing Sheets

(56) References Cited

U.S. PATENT DOCUMENTS

| | | | | |
|---|---|---|---|---|
| 6,288,896 | B1* | 9/2001 | Hsu | G06F 1/203 |
| | | | | 174/15.2 |
| 7,288,895 | B2* | 10/2007 | Rossi | H01J 61/52 |
| | | | | 315/112 |
| 7,417,863 | B2* | 8/2008 | Park | H05K 7/20445 |
| | | | | 361/679.48 |
| 9,986,667 | B2 | 5/2018 | Nikkhoo et al. | |
| 10,169,827 | B1* | 1/2019 | Paulus | G06Q 40/123 |
| 10,433,467 | B2 | 10/2019 | Hurbi et al. | |
| 10,823,969 | B1* | 11/2020 | Hoover | H01M 10/653 |
| 10,860,070 | B2 | 12/2020 | Woods et al. | |
| 11,163,161 | B2 | 11/2021 | Woodman et al. | |
| 2008/0130221 | A1* | 6/2008 | Varadarajan | G06F 1/203 |
| | | | | 361/679.52 |
| 2009/0071632 | A1* | 3/2009 | Bryant | F28D 15/04 |
| | | | | 165/104.26 |
| 2016/0209659 | A1* | 7/2016 | Nikkhoo | G02C 5/18 |
| 2016/0212889 | A1* | 7/2016 | Nikkhoo | H01L 23/3736 |
| 2016/0363957 | A1 | 12/2016 | Stroetmann | |
| 2017/0167172 | A1* | 6/2017 | Jelbert | B26B 1/04 |
| 2017/0184863 | A1* | 6/2017 | Balachandreswaran | |
| | | | | G02B 27/0176 |
| 2017/0343293 | A1* | 11/2017 | Hurbi | F28F 21/087 |
| 2018/0196485 | A1* | 7/2018 | Cheng | G02B 27/0006 |
| 2018/0284855 | A1* | 10/2018 | North | G06F 1/203 |
| 2018/0284856 | A1* | 10/2018 | Shah | G06F 1/1616 |
| 2018/0347921 | A1* | 12/2018 | Morrison | H01L 23/3733 |
| 2019/0041922 | A1* | 2/2019 | Kurma Raju | G06F 1/1637 |
| 2019/0189042 | A1* | 6/2019 | Aurongzeb | G06F 1/1681 |
| 2019/0346887 | A1* | 11/2019 | Park | G06F 1/1681 |
| 2019/0369402 | A1 | 12/2019 | Woodman et al. | |
| 2020/0310138 | A1* | 10/2020 | Kamakura | H05K 9/0088 |
| 2020/0356143 | A1* | 11/2020 | Oh | G06F 1/203 |
| 2021/0055565 | A1 | 2/2021 | Moore et al. | |
| 2021/0103146 | A1 | 4/2021 | Travers et al. | |
| 2021/0103317 | A1* | 4/2021 | Raju | G06F 1/1681 |
| 2021/0109576 | A1* | 4/2021 | Kurma | G06F 1/203 |
| 2021/0259119 | A1* | 8/2021 | Seo | H05K 5/0017 |
| 2021/0325691 | A1* | 10/2021 | Ashwood | G02C 11/10 |
| 2022/0159881 | A1* | 5/2022 | Watanabe | G06F 1/206 |
| 2022/0344243 | A1* | 10/2022 | Hur | G06F 1/20 |
| 2023/0121174 | A1* | 4/2023 | Ohyama | G09F 9/301 |
| | | | | 361/679.27 |

OTHER PUBLICATIONS

International Search Report and Written Opinion for International Application No. PCT/US2023/012303, mailed May 26, 2023, 12 pages.

* cited by examiner

THERMAL HINGE SYSTEM

CROSS REFERENCE TO RELATED APPLICATIONS

This application claims the benefit of U.S. Provisional Application No. 63/306,930, filed Feb. 4, 2022, and U.S. Provisional Application No. 63/306,949, filed Feb. 4, 2022, both of which are incorporated herein by reference in their entirety.

BACKGROUND

Recent advances in battery technology have enabled computationally powerful portable electronic devices, which generate considerable amounts of heat. The increased heat generated by these devices, coupled with the continual demand for smaller and lighter devices makes it difficult to adequately transfer heat from one portion of a device to another and/or to dissipate heat from the portable electronic devices.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
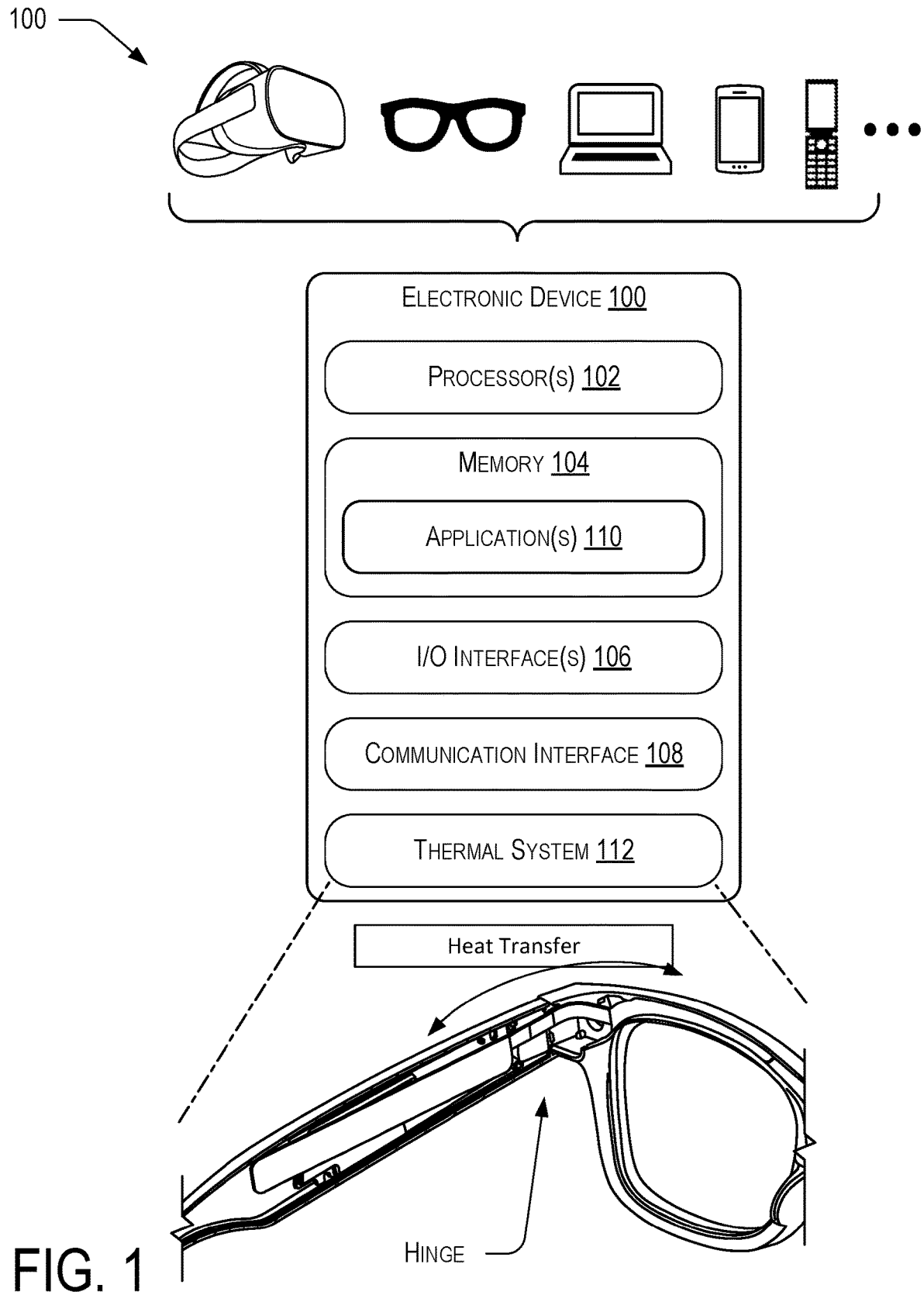
FIG. 1 illustrates an example electronic device usable to implement techniques such as those described herein.

This application describes a method and system to conduct thermal energy between two portions of an electric device across a hinge or other mechanical articulation. In examples, the method employs a system such as a thermal hinge system configured to transfer or spread thermal energy, and optionally electrical energy, through a mechanical articulation or hinge in an electronic device.

In examples, the electronic device may be a head mounted wearable device, such as a pair of glasses and the mechanical articulation or hinge may be located where the front frame of the glasses is connected to a temple or side arm portion. In examples, a thermal hinge system as described may enable transfer of heat or thermal energy and, optionally, electrical signals to and/or from the temple arm area to the frontal area of the glasses and vice versa through a mechanical articulation.

In examples, the electronic device may be a device other than glasses that includes a mechanical articulation or hinge between two portions across which heat transfer is desired.

Existing solutions do not always provide an efficient mechanism to transfer heat or thermal energy across a mechanical articulation. Thus, many existing electronic devices, and particularly head-mounted devices, suffer from hot spots and thermal differentials. This application describes techniques for transferring heat and optionally electrical signals between a first hinged portion (e.g., temple arm) and a second hinged portion (e.g., front frame) across a mechanical articulation. These techniques allow efficient heat transfer from the one portion of the electronic device to another portion, such as from the temple arm to the front frame, and vice versa, across a mechanical articulation.

In examples, a thermal hinge system may be configured to provide thermal conduit between two portions of an electronic device, such as for example, from temple arms to the front frame of wearable device. In examples, heat can shuttle from front to back and vice versa. In examples, the thermal hinge system may be nested or otherwise integrated into a mechanical articulation. In examples, the thermal hinge system may be configured such that heat flux can move freely end to end.

In examples, the thermal hinge system may provide an agnostic solution to various types of devices and be used for different portions of electronic devices, including for example in the front frame and/or the temple arms. In examples, the thermal hinge may be used in conjunction with one or more types of thermal management components such as, for example, graphite bodies, heat pipes, vapor chambers, thermal carbon fiber body, and others.

In examples, the thermal hinge system as described may lead to improved device architecture.

In examples, the thermal hinge system may include a living hinge, a pair of complementary thermal interface components, or both.

In examples, a thermal hinge system may include a thermally conductive living hinge that is positioned adjacent a mechanical articulation such as a physical hinge pin or other hinge structure. In examples, a living hinge may include a solid, bendable, and thermally conductive body configured to connect and provide thermal conductivity between two thermal management components of the thermal system in an electronic device via a mechanical articulation such as a hinge (e.g., couples a temple arm to a glasses frame). In some examples, the living hinge can include a layer of pyrolytic graphite (or other highly conductive material) to further enhance the thermal conductivity across the mechanical articulation. The living hinge can be coupled at each end to a thermal management component. In examples, a living hinge may have a curved width profile. In examples, a living hinge may include a strip including thermally conductive material extending from a first thermal management component located in a first hinged portion of the electronic device to a second thermal management component located in a second, complementary hinged portion of the electronic device. In examples, a first end of a thermal system may include a first thermal management component thermally coupled to an electronic structure, for example a printed circuit board (PCB) and/or other electronics disposed in a first hinged portion of an electronic device, a second end of the thermal system may include a second thermal management component coupled to another electronic structure such as a second PCB, a heatsink or other thermal dissipation component, or other electronics in a second hinged portion of the electronic device, and a living hinge connecting the first thermal management component to the second thermal management component.

In examples, a mechanical articulation may include a standard or barrel hinge. In examples, a mechanical articulation may include a pin hinge. In examples, a mechanical articulation may include a spring hinge or spring-loaded hinge, a pressure hinge, or any combination thereof.

In examples, a living hinge as described may extend along the mechanical articulation. In examples, the living hinge extends through a passive mechanical articulation such as a pin or barrel hinge. In examples, the living hinge functionalizes the coupling and the mechanical articulation provides passive structural support. In examples, a living hinge may include a small form factor, enabling a thin, light weight hinge design.

In examples, a thermal hinge system may include complementary and/or mating thermal interface components such as, blocks, pads, fingers, or like structures, provided on respectively hinged portions of an electronic device where the hinged portions are coupled by a mechanical articulation that is configured to provide pressure when engaged so as to press a thermal interface component located in one hinged portion against the thermal interface component located in the second hinged portion. In examples, a first thermal interface component provided at an interface surface of a first hinged portion of the electronic device and a second thermal interface component is provide at an interface surface of a second, complementary hinged portion of the electronic device, so that the first and second thermal interface components can come in contact with each other as the hinge is operated. For example, two metal blocks or mating members may be provided at opposite ends of hinged portions of a device that are configured to mate and provide thermal conduction pathway between the two portions. In examples, as the hinge or other mechanical articulation is operated the two portions of the device are displaced relative to each other and can bring the two metal blocks or members together in one position (e.g., a deployed or use position) or separate them in a second position (e.g., a stowed or non-use position). Thus, the techniques described herein may provide a thermal conduction pathway that may be connected and disconnected with the operation of the mechanical articulation or hinge.

In examples, pressure between the two thermal interface components in the first position may be provided by a force in addition to and/or in place of what is provided by the mechanical articulation. In examples, the coupled hinged portions may be configured to experience a force when the electronic device is in the first position (e.g., the use position) that may result in pressure at the interface of the two thermal interface components. For example, where the electronic device is a pair of glasses and a mechanical articulation is configured to couple the front frame of the glasses to a temple arm of the glasses, pressure at the interface of the two thermal interface components may be provided when a user is wearing the glasses. For example, a thermal interface component may be disposed on the front frame and be configured to contact and transfer heat to/from a second thermal interface component (e.g., complimentary blocks, pads, fingers, or like structure) disposed on the temple arm portion. In examples, the first interface component is a first metal block and the second interface component is a second metal block. In examples, the glasses may be configured so that when a user wears them the temple arms may be forced outward thus increasing the pressure at the coupler connecting the side arm to the front frame and thus cause or enhance contact pressure between the thermal interface components.

In examples, the first thermal interface component may be thermally coupled (e.g., welded, brazed, adhered using an adhesive such as a high-K epoxy, etc.) to a thermal management component in a first hinged portion of an electronic device to receive heat from electronic structures in the first hinged portion, while the second thermal interface component may be coupled to a second thermal management component disposed in a second hinged portion of the electronic device to receive heat from electronic structures therein. In examples, the second hinged portion containing the second thermal management component may further include a heat dissipating structure such as a heatsink or other thermal dissipation component. The first thermal interface component may be brought into contact with the second thermal interface component when the hinged portions of the electronic device are rotated relative each other in at least one direction. Once in contact, the thermal interface components may be configured to provide a thermally conductive pathway to transfer heat from the face portion to the temple portions and vice versa.

In examples, the thermal interface components may be made of materials having a high coefficient of thermal conductivity, such as copper, tin, indium, aluminum, magnesium, nickel, and other materials. The material used for the thermal interface components may be based on the dimensions of the contact area and the force of contact between the thermal interface components (e.g., softer materials may be more suitable for lower contact forces, while harder materials may be more suitable to higher contact forces).

In some examples, the thermal interface components may include surface features (e.g., fingers, teeth, etc.) to increase a contact surface area. In examples, one or more surface treatments may be employed for the contact surface of a thermal interface component to lower thermal resistance at the interface or pathway. In some examples, guide pins or keys may be used to align the features of the thermal interface components. In some examples, a thermal interface component in one hinged portion of the electronic device may be floating to allow it to align with the thermal interface component located in the second hinged portion of the electronic device, or vice versa.

In examples, provided is a configuration for transferring thermal energy across a mechanical articulation, such as between a glasses front frame and a temple arm. In examples, a first thermal interface component of thermal interface material (e.g., metal) may be coupled to a thermal management component located in a first hinged portion of an electronic device and a second thermal interface component including a thermal interface material may be coupled to a thermal management component in a second hinged portion of the electronic device. For example, a bi-layer laminated structure (PCB and a continuous Flexible Heat Pipe stretching from one end to the other) are situated inside the temple arms and front frame area of an extended reality device. A mechanism is used to enable fold and unfold portions of the device without interruption. In examples, the flexible heat pipe may be configured to remove heat from any local hot spot on the PCB and iso-thermalize the device. In examples, flexible Kapton Heat Pipe may be used as a thermal management component substrate to surface mount the electronics using surface-mount technology (SMT) and improve parts count and volumetric efficiency. When the first and second hinged portions are rotated in at least one direction, the first thermal interface component of thermal interface material may be configured to come into contact with the second thermal interface component having a thermal interface material and provide a path to conduct thermal energy across the mechanical articulation. In examples, when the first and second hinged portions are rotated in an opposite direction relative each other, the thermal interface components of thermal interface material may be configured to separate and/or be in a position in which they do not touch and the thermal pathway between the hinged portions of the electronic device may be severed and/or discontinued.

In examples, the thermal system as described including a thermal hinge system such as a living hinge, thermal interface components, or both, as described herein may reduce thermal differentials between the first and second hinged portions of an electronic device, increase an effective surface area over which an electronic device may be able dissipate heat thereby increasing the total amount of heat that the device is able to dissipate, or any combination thereof.

In examples, an electronic device may be configured to include one or more thermal systems as described herein. In examples, the thermal system may be configured to spread heat across different portions of the electronic device. In examples, to spread heat a thermal system may include one or more thermal management components. In examples, spreading heat across different portions of the electronic device can enhance the dissipation of heat from the electronic device to the environment. In examples, spreading heat across different portions of the electronic device may include transferring heat from a first region of the electronic device to a second region of the electronic device. In examples, spreading heat across different portions of the electronic device may preempt overheating at one location of the electronic device. In examples, the thermal system may cause the electronic device to achieve or advance toward an isothermal condition.

Examples of a thermal management component of a thermal system may include a heat pipe or a vapor chamber. Other types of thermal management components may also be used such as strips of thermally conductive material such as graphite, graphite composite, polymer, metal, metal alloys, or any combination thereof. In examples, a thermal management component may have a width or an internal diameter or internal width if it is a hollow structure in the range of 5 to 20 mm In examples, a thermal management component may be larger or smaller than the ranges listed and/or can be made by additional or alternative manufacturing techniques. In examples, a thermal management component may have any cross-sectional shape, such as for example, circular, triangular, quadrilateral, polygonal, symmetrical, asymmetrical, regular, or irregular.

In examples, a thermal management component may be configured as a heat pipe or a vapor chamber and may hold a working fluid (e.g., water, ionized water, glycol/water solutions, alcohol, acetone, dielectric coolants, etc.) that may be used to actively remove heat from components thermally coupled to the thermal management component. In one example, a heat pipe or vapor chamber may include titanium, copper, or any combination thereof.

In some examples, the working fluid may be circulated through a heat pipe or vapor chamber via capillary action and thermal differentials throughout the thermal system. In some examples, the working fluid may be actively pumped throughout the heat pipe or vapor chamber to increase the rate at which the working fluid circulates.

In examples, a thermal management component may include a heat pipe or vapor chamber including a flex circuit material. For example, the heat pipe or vapor chamber may include an outer wall of or including flex circuit material. In examples, the flex circuit material may include a polymer and a metal.

In some examples, a thermal management component may additionally or alternatively include and/or be coupled to one or more other thermal management features (e.g., heatsinks, fins, radiators, fans, compressors, etc.) which may further increase the ability of the thermal management component to remove heat from components of the electronic device.

In examples, a living hinge and/or a thermal interface component may be bonded to a thermal management component by an adhesive, thermal bonding, ultrasonic bonding, brazing, soldering, a mechanical means such as one or more fasteners, for example, clamps, screws, bolts, or similar devices. In examples, a thermal interface component may be bonded to a thermal management component by injection molding or thermal forming In examples, any combination of these methods may be used to bond a thermal management component to a living hinge and/or a thermal interface component.

In examples, a system to conduct thermal energy between two hinged portions of an electric device including a living hinge extending from a first hinged portion to a second hinged portion; a first thermal management component connected to a first end of the living hinge; and a second thermal management component connected to a second end, opposite the first end, of the living hinge, wherein the living hinge including a material that is thermally conductive.

In examples, each of the first thermal management component and the second thermal management component may include a heat pipe or a vapor chamber.

In examples, the first thermal management component and the second thermal management component may be connected to the living hinge via welding, thermosonic bonding, brazing, mechanical fastener, adhesive, or any combination thereof.

In examples, the living hinge may include a curved cross-sectional shape.

In examples, the living hinge may be electrically conductive.

In examples, the living hinge may be configured to transition between a bent state and a straightened state.

In examples, the living hinge may be biased toward a straightened state.

In examples, a method of transferring thermal energy between two hinged portions of an electronic device including providing an electronic device comprising a first hinged portion including a first thermal management component and a second hinged portion comprising a second thermal management component, the first hinged portion and the second hinged portion being coupled by a mechanical articulation and a thermally conductive living hinge being bonded to the first thermal management component at one end and to the second thermal management component at an opposite, second end; transferring thermal energy from an electronic structure provided in the first hinged portion to the first thermal management component; transferring the thermal energy from the first thermal management component to the living hinge; transferring the thermal energy from the living hinge to the second thermal management component; and transferring the thermal energy from the second thermal management component to the second hinged portion.

In examples, an electronic device may include a first hinged portion including a first thermal management component; a second hinged portion including a second thermal management component; a mechanical articulation coupling the first hinged portion to the second hinged portion; and a living hinge bonded to the first thermal management component and the second thermal management component and extending through the mechanical articulation.

In examples, the living hinge may include a thermally conductive material.

In examples, the living hinge may include an electrically conductive material.

In examples, the living hinge may be bonded to the first thermal management component and to the second thermal management component via welding, thermosonic bonding, brazing, mechanical fastener, adhesive, or any combination thereof.

In examples, the living hinge may include a curved cross-section.

In examples, the living hinge may be configured to transition between a bent state and a straighten state.

In examples, the living hinge may be configured to be biased toward the straighten state.

In examples, the first thermal management component and the second thermal management component may each independently include a vapor chamber, a heat pipe, a strip of thermally conductive material, or any combination thereof.

In examples, at least one of the first thermal management component and the second thermal management component may include a flex circuit.

In examples, the mechanical articulation may include a barrel hinge.

In examples, the electronic device may include a first thermal interface component in the first hinged portion and a second thermal interface component in the second hinged portion, the first thermal interface component and the second thermal interface component arranged such that they come into physical contact with each other when the living hinge is in a straightened state and are spaced apart when the living hinge is in a bent state.

In examples, the electronic device may include a wearable device.

In examples, a system to conduct thermal energy between a first hinged portion and a second hinged portion of an electric device, the first hinged portion and second hinged portion being coupled together by a mechanical articulation, including a first thermal interface component located in the first hinged portion and associated with the mechanical articulation; and a second thermal interface component located in the second hinged portion and associated with the mechanical articulation, wherein the first thermal interface component and the second thermal interface component may be configured to be movable between a first position in contact with each other and forming a thermal pathway between the first hinged portion and the second hinged portion and a second position spaced apart to break the thermal pathway.

In examples, the first thermal interface component may include a first surface finish and a first surface feature and the second thermal interface component may include a second surface finish and a second surface feature, the first surface feature and the second surface feature being complementary to each other and configured to mate when the first thermal interface component and the second thermal interface component are in the first position.

In examples, the first thermal interface component may include a surface feature, and the second thermal interface component may include a coating configured to accommodate the surface feature when the first thermal interface component is pressed against the second thermal interface component.

In examples, the first thermal interface component may include one or more curved protrusion, a coating, and one or more first surface features over the coating, and the second thermal interface component may be configured to accommodate the first thermal interface component when the first thermal interface component and the second thermal interface component are pressed together.

In examples, the second thermal interface component may include one or more second surface features that are complementary to the first surface features.

In examples, the mechanical articulation may be spring-loaded.

In examples, a method of controlling transfer of thermal energy between two hinged portions of an electronic device including providing an electronic device having a first hinged portion comprising a first thermal interface component and a second hinged portion comprising a second thermal interface component, the first hinged portion and the second hinged portion being coupled by a mechanical articulation; causing thermal energy to be transferred to the first thermal interface component; and operating the mechanical articulation by applying a force to displace the first hinged portion of the electronic device relative to the second hinged portion of the electronic device to cause the first thermal interface component to come into physical contact with the respective second thermal interface component and form a thermal pathway to transfer the thermal energy between the first thermal interface component and the second thermal interface component.

In examples, the method may include transferring the thermal energy from an electronic structure to a first thermal management component located in the first hinged portion prior to causing the thermal energy to be transferred to the first thermal interface component; and transferring the thermal energy from the second thermal interface component to a second thermal management component located in the second hinged portion after the thermal energy is transferred between the first thermal interface component and the second thermal interface component.

In examples, the method may include operating the mechanical articulation to displace the first hinged portion of the electronic device relative to the second hinged portion of the electronic device to cause the first thermal interface component to become spaced apart from the respective second thermal interface component and interrupt the thermal pathway to transfer the thermal energy between the first thermal interface component and the second thermal interface component.

In examples, an electronic device may include a first hinged portion; a second hinged portion; a first mechanical articulation coupling the first hinged portion to the second hinged portion; a first thermal interface component located in the first hinged portion and associated with the first mechanical articulation; and a second thermal interface component located in the second hinged portion and associated with the first mechanical articulation, wherein the first thermal interface component and the second thermal interface component may be configured to be movable between a first position in contact with each other and form a thermal pathway between the first hinged portion and the second hinged portion and to a second position spaced apart to break the thermal pathway.

In examples, the first thermal interface component may include a first surface finish and a first surface feature and the second thermal interface component may include a second surface finish and a second surface feature, the first surface feature and the second surface feature being complementary to each other and configured to mate when the first thermal interface component and the second thermal interface component are in the first position.

In examples, the first thermal interface component may include a surface feature, and the second thermal interface component may include a coating configured to accommodate the surface feature when the first thermal interface component is pressed against the second thermal interface component.

In examples, a first thermal management component may be provided in the first hinged portion and thermally coupled to an electronic structure and bonded to the first thermal interface component; and a second thermal management component may be provided in the second hinged portion and bonded to the second thermal interface component.

In examples, the first thermal management component and the second thermal management component may be each independently a vapor chamber, heat pipe, or thermally conductive strip of material.

In examples, the first thermal management component and the second thermal management component each independently may include a flex circuit.

In examples, the electronic device may include a wearable device.

In examples, the wearable device may include a pair of extended reality glasses, wherein the first hinged portion is a temple arm and the second hinged portion is a front frame of the pair of extended reality glasses.

In examples, the electronic device may include a third hinged portion; a second mechanical articulation coupling the third hinged portion to the second hinged portion; a third thermal interface component located in the third hinged portion and associated with the second mechanical articulation; and a fourth thermal interface component located in the second hinged portion and associated with the second mechanical articulation, wherein the third thermal interface component and the fourth thermal interface component may be configured to be displaced from one position to contact each other and form a thermal pathway between the third hinged portion and the second hinged portion to another position to be spaced apart to break the thermal pathway.

In examples, the electronic device may include a pair of extended reality glasses, wherein the first hinged portion may be a first temple arm of the extended reality glasses, the second hinged portion may be a front frame of the extended reality glasses, and the third hinged portion may be a second temple art of the pair of extended reality glasses.

In examples, the electronic device may include a living hinge extending from the first hinged portion to the second hinged portion and along the first mechanical articulation.

These and other aspects are described further below with reference to the accompanying drawings and appendices. The drawings are merely example implementations and should not be construed to limit the scope of the claims. For example, while examples are illustrated in the context of a head-mounted electronic device, the techniques may be used in association with any electronic device.

FIG. 1 illustrates an example electronic device 100 usable to implement techniques such as those described herein. The electronic device 100 may be representative of a wearable device such as a watch or a head-mounted device like an extended reality headset or glasses, or a portable device such as a laptop computer, a mobile device such as a tablet or mobile phone, or any other electronic device such as those described throughout this application. In some examples, the electronic device may be an extended reality device configured to generate an extended reality environment (e.g., virtual reality, mixed reality, augmented reality, or other computer-generated environment). The computing device can be implemented as standalone computing device comprising substantially all functionality in a single device, or can be coupled via wired or wireless connection to one or more other computing devices (e.g., PCs, servers, gateway devices, coprocessors, etc.), peripheral devices, and/or input/output devices.

In examples, the electronic device 100 may include at least a first hinged portion coupled to a second hinged portion.

As shown, the electronic device 100 may include one or more electronic structures such as processors 102, memory 104, input/output interfaces 106 (or "I/O interfaces 106"), and communication interfaces 108, which may be communicatively coupled to one another by way of a communication infrastructure (e.g., a bus, traces, wires, etc.). While the electronic device 100 is shown in FIG. 1 having a particular configuration, the components illustrated in FIG. 1 are not intended to be limiting. The various components can be rearranged, combined, and/or omitted depending on the requirements for a particular application or function. Additional or alternative components may be used in other examples.

In some examples, the processor(s) 102 may include hardware for executing instructions, such as those making up a computer program or application. For example, to execute instructions, the processor(s) 102 may retrieve (or fetch) the instructions from an internal register, an internal cache, the memory 104, or other computer-readable media, and decode and execute them. By way of example and not limitation, the processor(s) 102 may comprise one or more central processing units (CPUs), graphics processing units (GPUs), holographic processing units, microprocessors, microcontrollers, integrated circuits, programmable gate arrays, or other hardware components usable to execute instructions.

The memory 104 is an example of computer-readable media and is communicatively coupled to the processor(s) 102 for storing data, metadata, and programs for execution by the processor(s) 102. In some examples, the memory 104 may constitute non-transitory computer-readable media such as one or more of volatile and non-volatile memories, such as Random-Access Memory ("RAM"), Read-Only Memory ("ROM"), a solid-state disk ("SSD"), Flash, Phase Change Memory ("PCM"), or other types of data storage. The memory 104 may include multiple instances of memory and may include internal and/or distributed memory. The memory 104 may include removable and/or non-removable storage. The memory 104 may additionally or alternatively include one or more hard disk drives (HDDs), flash memory, Universal Serial Bus (USB) drives, or a combination these or other storage devices.

As shown, the electronic device 100 includes one or more I/O interfaces 106, which are provided to allow a user to provide input to (such as touch inputs, gesture inputs, key strokes, voice inputs, etc.), receive output from, and otherwise transfer data to and from the electronic device 100. Depending on the particular configuration and function of the electronic device 100, the I/O interface(s) 106 may include one or more input interfaces such as keyboards or keypads, mice, styluses, touch screens, cameras, microphones, accelerometers, gyroscopes, inertial measurement units, optical scanners, other sensors, controllers (e.g., handheld controllers, remote controls, gaming controllers, etc.), network interfaces, modems, other known I/O devices or a combination of such I/O interface(s) 106. Touch screens, when included, may be activated with a stylus, finger, thumb, or other object. The I/O interface(s) 106 may also include one or more output interfaces for presenting output to a user, including, but not limited to, a graphics engine, a display (e.g., a display screen, projector, holographic display, etc.), one or more output drivers (e.g., display drivers), one or more audio speakers, and one or more audio drivers. In certain examples, I/O interface(s) 106 are configured to provide graphical data to a display for presentation to a user. The graphical data may be representative of one or more graphical user interfaces and/or any other graphical content as may serve a particular implementation. By way of example, the I/O interface(s) 106 may include or be included in a wearable device, such as a head-mounted display (e.g., headset, glasses, helmet, visor, etc.), a suit, gloves, a watch, or any combination of these, a handheld electronic device (e.g., tablet, phone, handheld gaming device, etc.), a portable electronic device (e.g., laptop), or a stationary electronic device (e.g., desktop computer, television, set top box, a vehicle electronic device). In some examples, the I/O interface(s) 106 may be configured to provide an extended reality environment or other computer-generated environment.

The electronic device 100 may also include one or more communication interface(s) 108. The communication interface(s) 108 can include hardware, software, or both. In examples, communication interface(s) 108 may provide one or more interfaces for physical and/or logical communication (such as, for example, packet-based communication) between the electronic device 100 and one or more other electronic devices or one or more networks. As an example, and not by way of limitation, the communication interface(s) 108 may include a network interface controller (NIC) or network adapter for communicating with an Ethernet or other wire-based network and/or a wireless NIC (WNIC) or wireless adapter for communicating with a wireless network, such as a WI-FI adapter. In examples, communication interface(s) 108 can additionally include a bus, which can include hardware (e.g., wires, traces, radios, etc.), software, or both that communicatively couple components of electronic device 100 to each other. In examples, the electronic device 100 may include additional or alternative components that are not shown, such as, but not limited to, a power supply (e.g., batteries, capacitors, etc.), a housing or other enclosure to at least partially house or enclose any or all of the components.

The memory 104 may store one or more applications 110, which may include, among other things, an operating system (OS), productivity applications (e.g., word processing applications), communication applications (e.g., email, messaging, social networking applications, etc.), games, or the like. The application(s) 110 may be implemented as one or more stand-alone applications, as one or more modules of an application, as one or more plug-ins, as one or more library functions application programming interfaces (APIs) that may be called by other applications, and/or as a cloud-computing model. The application(s) 110 can include local applications configured to be executed locally on the electronic device, one or more web-based applications hosted on a remote server, and/or as one or more mobile device applications or "apps."

In examples, the electronic device 100 may also include a thermal system 112 including a living hinge, thermal interface components, or both as described herein, to which the other electronic structures such as a printed circuit board (PCB), the processor(s) 102, memory 104, I/O device(s) 106, and/or communication interface(s) 108 can be thermally coupled. In examples, the thermal system 112 may include a thermal management component that is thermally conductive and configured to spread heat generated by the one or more other components. In some examples, a thermal management component may additionally or alternatively include and/or be coupled to one or more other thermal management features (e.g., heatsinks, fins, radiators, fans, compressors, etc.) which may further increase the ability of the thermal management component to remove heat from components of the electronic device.

The thermal system 112 may include one or more thermal management components made of a relatively light weight, rigid or flexible material such as any of those described herein, and may be configured to exhibit manufacturing tolerances suitable for mounting precision optical components (e.g., lenses, display screens, mirrors, gratings, optical fibers, light pipes, etc.).

In examples, as illustrated in FIG. 1, the electronic device 100 may include at least a first hinged portion coupled to a second hinged portion and a thermal system 112 configured to enable heat transfer across the hinge.

In examples, the electronic device 100 may include one or more mechanical articulations that pivot, rotate, bend, flex, or otherwise translate across a plane. In examples, a coupler configured to provide mechanical articulation provided in an electronic device may include a hinge, fold, joint, pivoting element, or other flexible joint and/or bendable member. In examples, a thermal system 112 may include a living hinge extending through at least a portion of a mechanical articulation such as one provided by a coupler. In examples, a mechanical articulation may include complementary and/or mating thermal interface components that when in contact with each other can transfer heat between them. In examples, a combination of the living hinge and thermal interface components may be provided at the mechanical articulation. In examples, a thermal system 112 including one or more thermal management components and one or more living hinge and/or thermal interface components may extend from a first region of the electronic device 100 to a second region of the electronic device 100, wherein a mechanical articulation is located between the first region and the second region of the electronic device 100. In examples, the living hinge extends from a first elongated and/or planar portion of electronic device 100, across and/or through a coupler that provides a mechanical articulation and reach a second elongated and/or planar portion of the electronic device 100. In examples, thermal interface components may be provided at the mechanical articulation and configured to come in contact with each other to transfer heat.

For example, an example electronic device 100 may be as an extended reality headset or glasses. The electronic device may include a first elongated and/or planar portion, such as a face front portion, and a second elongated and/or planar portion, such as a temple arm or side portion, with a mechanical articulation such as a hinge or fold between the first elongated and/or planar portion and the second elongated and/or planar portion. In examples, a thermal system 112 may include a thermal hinge and at least two thermal management components. In examples the thermal system 112 may be provided to extend from first flat portion to second flat portion and across or through a mechanical articulation or coupler. In examples, the thermal hinge may include a living hinge, thermal interface components, or a combination of both at the mechanical articulation. In examples, a living hinge may be configured to extend along the mechanical articulation and allow for thermal flow between the thermal management components to which it is bonded. In examples, thermal interface components in respective hinged portions of the electronic device may be configured to come into contact when the mechanical articulation or coupler is operated in at least one direction and may be able to transfer heat between each other when in contact and thus transfer heat from the first elongated and/or planar hinged portion to the second elongated and/or planar hinged portion of the electronic device 100. In examples, the electronic device may include one or more of the previously discussed electronic structures (e.g., printed circuit boards, processor(s) 102, memory 104, I/O device(s) 106, and/or communication connection(s) 108) at least at or near first flat portion. In examples, the one or more electronic structures may be thermally coupled at least to a portion of thermal system 112 that extends across first flat portion. As the electronic device is used, heat generated from the one or more electronic structures in the first flat portion may be transferred to the portion of the thermal system 112 located in the first flat portion. In examples, thermal system 112 may be configured to transfer or spread the heat from the one or more electronic structures to the second flat portion of the electronic device. In examples, heat may be transferred within a thermal management component that is included in thermal system 112 via capillary action from an evaporator region to a condenser region, and/or via thermal conduction. In examples, the heat transferred within thermal system 112 may transfer across one or more living hinges and/or pairs of thermal interface components.

In examples, a thermal system may include one or more thermal management components and one or more living hinges, thermal interface components, or both. In examples, the thermal system may include a single thermal management component or two or more connected thermal management components. In examples, a thermal management component may have an internal diameter and/or internal width ranging from sub-millimiter to 20 mm, for example, from 0.15 mm to 20 mm, 0.15 mm to 1 mm, 1 mm to 2 mm, 2 mm to 3 mm, 3 mm to 4 mm, or 5 mm to 10 mm In examples, a living hinge and/or thermal interface components of the thermal system may be bonded to a thermal management component. In examples, a living hinge and/or thermal interface components may be provided between two thermal management components.

In examples, a living hinge may have a thickness of about 0.2 mm to 0.5 mm, for example, 0.2 mm, 0.25 mm, 0.3 mm, 0.35 mm, 0.4 mm, 0.45 mm, or 0.5 mm In examples, the living hinge may have a thickness with a range defined by any two of these examples.

In examples, a thermal interface component may have a thickness of about 0.5 to 2 mm, for example, 0.5 mm, 0.75 mm, 1 mm, 1.25 mm, 1.50 mm, 1.75 mm, or 2 mm In examples, each thermal interface component may have a thickness within a range defined by any of two of these examples. In examples, the contact area of a thermal interface component may be about 50 mm$^2$. In examples, the contact area of a thermal interface component may be within the range of 40 to 60 mm$^2$, for example, 45 to 55 mm$^2$, 45 to 50 mm$^2$, 50 to 55 mm$^2$, 55 to 60 mm$^2$.

In examples, a thermal management component may include a light-weight structural element. A thermal management component can be sized and shaped to any desired dimensions for a given design architecture. In examples, a thermal management component may include an outer shell. In examples, an outer shell to a thermal management component may include a high thermally conductive material. In examples, an outer shell of a thermal management component may include a metal such as, titanium, copper, aluminum, magnesium, steel, or any alloys and/or combinations thereof. In examples, the copper may be oxygen free copper (OFC). In examples, an outer shell of thermal management component may include high strength polymers (such as polyamideimide (PAI), polyetherimide (PEI), polyetheretherketone (PEEK), polyphenylene sulfide (PPS), Nylon, with or without fiber reinforcement), polyurethane, polypropylene, polyimide, composites such as carbon fiber or fiberglass, or any combination thereof. Other materials may also be used. In examples, the outer shell of a thermal management component may include a flex circuit material. In examples, the thermal management component may include graphite. Any combination of the listed examples may also be used.

In examples, a thermal management component may include a fluid to improve heat transfer and/or heat dissipation as described with respect to thermal management component herein. The fluid may be any suitable fluid to transfer heat. In examples, the fluid may be dihydrogen monoxide (i.e. water), deionized water, an aqueous solution such as for example solutions of ethylene glycol and water or propylene glycol and water, an alcohol, or an organic fluid such as for example acetone, dielectric coolants, and perfluorinated carbon solutions. Other fluids may also be implemented.

In examples, a thermal system and/or a thermal management component comprised in a thermal system may include one or more nodes (e.g., pads, tabs, other mounting surfaces) on an outer shell of a thermal management component. In examples, one or more nodes may be used to couple one or more electronic structures such as PCB, transistors, processors, or other like electronic structures and/or intervening layers to a thermal system. In examples, one or more nodes may be formed by machining surfaces of a thermal system and/or a thermal management component, welding and/or brazing them to thermal system and/or a thermal management component, fastening them to the thermal system and/or a thermal management component using mechanical fasteners (e.g., screws, rivets, snap connections, etc.), additively manufacturing them onto the thermal system and/or to a thermal management component, or by any other process.

FIGS. 2A-2F illustrate examples of a living hinge in a thermal system of an electronic device.

Figure 2A:
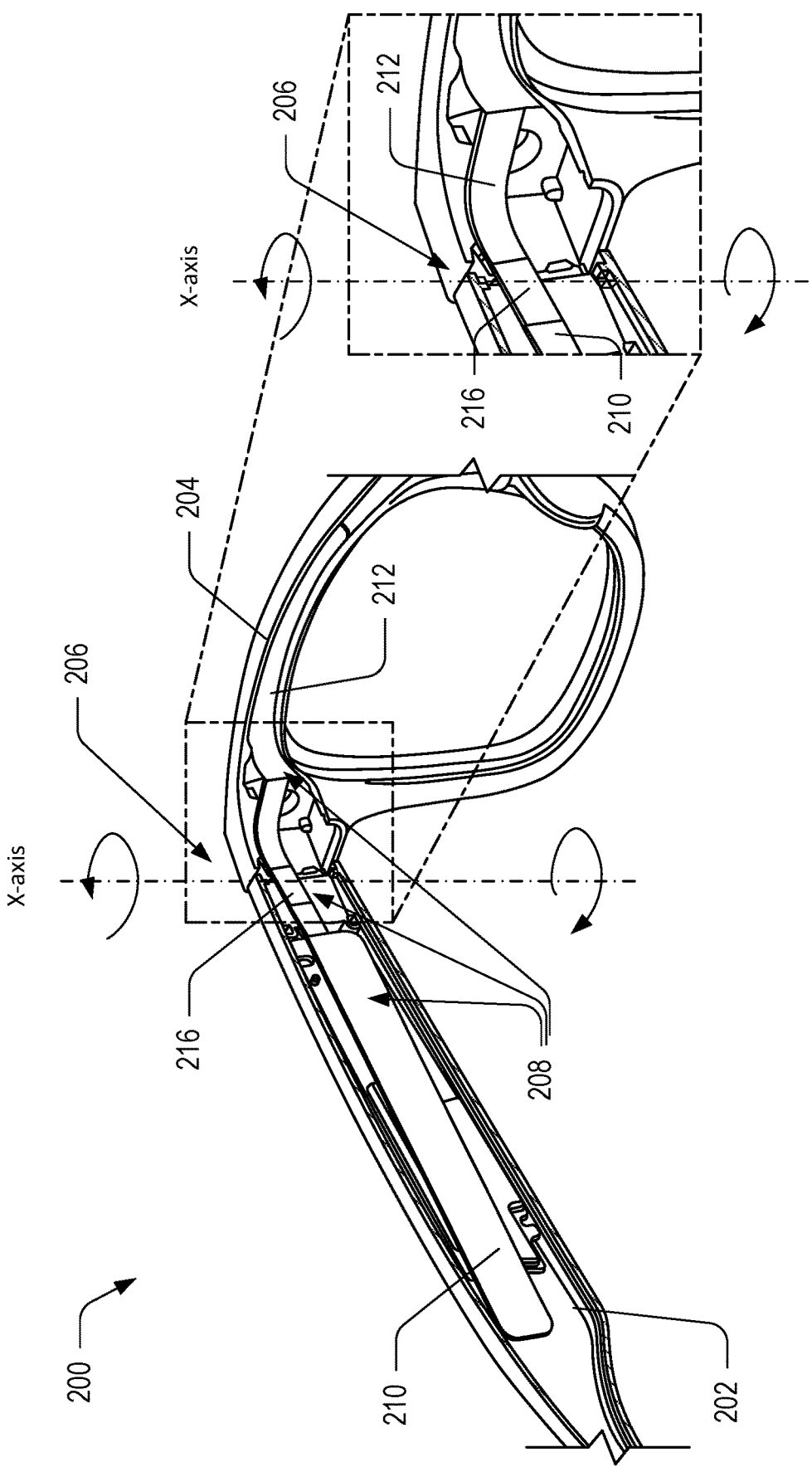
FIGS. 2A-2F illustrate examples of a living hinge in a thermal system of an electronic device.

FIG. 2A illustrates an example electronic device 200. As illustrated, electronic device 200 may be a set of extended reality glasses. This is only an example as the living hinge as described may be used in other types of electronic devices in a similar manner In examples, electronic device 200 may include a first hinged portion 202 and a second hinged portion 204. For example, as shown in FIG. 2A, first hinged portion 202 may be a temple arm of the extended reality glasses while the second hinged portion 204 may be the front frame of the extended reality glasses. In examples, the first hinged portion 202 may be coupled to the second hinged portion 204 via a mechanical articulation 206. In examples, the mechanical articulation 206 may be a barrel hinge such as a pin and hole coupler. Other types of hinges as previously described may also be used.

In examples, electronic device 200 may include a thermal system 208 having one or more thermal management components. In examples, first hinged portion 202 and second hinged portion 204 may each include one or more thermal management components that are part of a thermal system 208. For example, a first hinged portion 202 may include at least a first thermal management component 210, and the second hinged portion may include at least a second thermal management component 212. In examples, the first thermal management component 210 and/or the second thermal management component 212 may be thermally and optionally electrically coupled to one or more electronic structures. For example, as shown in FIG. 2A, the first thermal management component 210 may be coupled to an electronic structure 214 such as a printed circuit board (PCB). In examples, electronic structure 214 may generate heat that thermal system 208 may be configured to spread across other portions of electronic device 200. In examples, the second thermal management component may be coupled to a heatsink or other thermal dissipation component, or other electronics of the electronic device.

In examples, first thermal management component 210 and second thermal management component 212 may be similar or different structures. In examples, a thermal management component may include a heat pipe, a vapor chamber, a thermally conductive structure or any combination thereof. In examples, a thermal management component may include a material as previously described. In examples, a thermal management material may include copper, graphite, flex circuit or any combination thereof. In examples, at least one of the first thermal management component 210 or the second thermal management component 212 may include a flexible thermal management component. In examples, a flexible thermal management component may include a heat pipe or a vapor chamber. In examples, a flexible thermal management component may include a flex circuit. In examples, a flexible thermal management component may include a heat pipe or vapor chamber that include an outer wall of flex circuit material. In examples, a flex circuit material may include a polymer, metal or metal foil, or a combination of both. In examples, the polymer may include polyimides, polyesters, or other polymer. In examples, the metal or metal foil may include cupper, copper alloy, or other electrically conductive material.

In some examples, a thermal management component may additionally or alternatively include and/or be coupled to one or more other thermal management features (e.g., heatsinks, fins, radiators, fans, compressors, etc.) which may further increase the ability of the thermal management component to remove heat from components of the electronic device.

In examples, examples a thermal management component may have a thickness of about 0.1 mm to 0.3 mm, for example, 0.11 mm, 0.12 mm, 0.13 mm, 0.14 mm, 0.15 mm, 0.16 mm, 0.17 mm, 0.18 mm, 0.19 mm, 0.2 mm, 0.25 mm, or 0.3 mm In examples, a thermal management component may have a thickness within a range defined by any two of the examples listed.

In examples, thermal system 208 may include a thermally conductive and, optionally electrically conductive, living hinge 216. In examples, living hinge 216 may have an effective length ranging from about 5 mm to 15 mm Other effective lengths may also be possible. In examples, living hinge 216 may have a thickness as previously described of about 0.2 mm to 0.5 mm, for example, 0.2 mm, 0.25 mm, 0.3 mm, 0.35 mm, 0.4 mm, 0.45 mm, or 0.5 mm In examples, the living hinge 216 may have a thickness with a range defined by any two of these examples. In examples, living hinge 216 includes a thermally conductive material, for example, graphite. In examples, living hinge 216 may include a material as also described previously, for example aluminum, steel, titanium. Other metals may also be used. In examples, living hinge 216 may include an electrically conductive material. In examples, living hinge 216 may include a composite of two or more materials. For example, living hinge 216 may include an alloy, a metal mixture, or combination of polymer material and metal. In examples, living hinge 216 may include two or more materials wherein some materials may be thermally and/or electrically conductive and some may be thermally and/or electrically insulating.

Figure 2B:
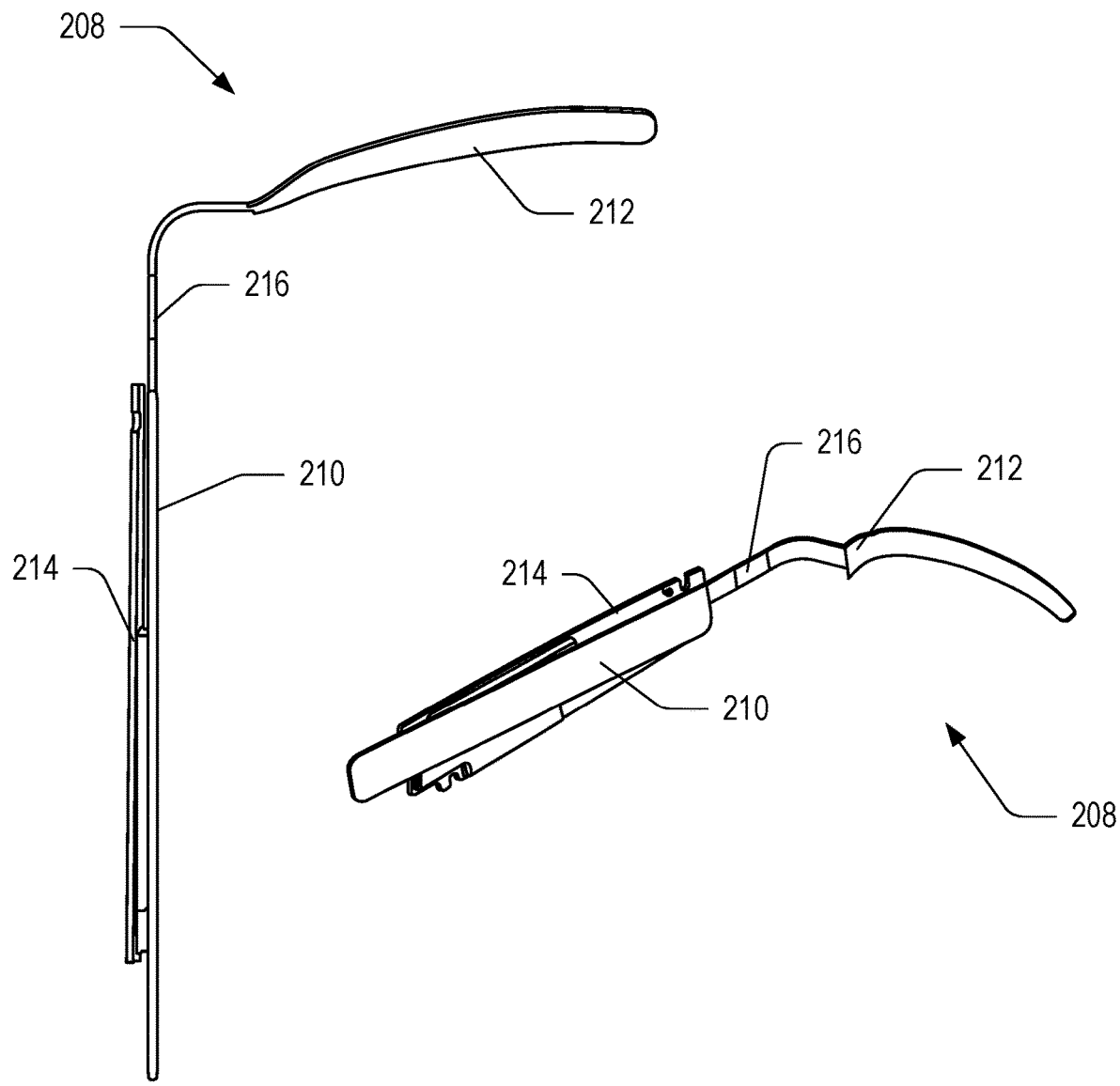

In examples, living hinge 216 may be bonded at opposite ends to thermal management components. For example, as illustrated in FIGS. 2A and 2B, living hinge 216 may be bonded at one end to first thermal management component 210 and at second, opposite end, to second thermal management component 212. In examples, living hinge 216 is configured to transfer heat from one thermal management component to another thermal management component. For example, as illustrated, living hinge 216 may transfer heat between the first thermal management component 210 and the second thermal management component 212. In examples, where the first thermal management component 210 is thermally coupled to an electronic structure 214 such as a PCB, the heat may be transferred from the electronic structure 214 to the first thermal management component 210. In examples, a method of transferring and/or spreading heat or thermal energy across different portions of an electronic device 200 may include spreading the heat from the first thermal management component 210 to the second thermal management component 212 by conducting heat through living hinge 216. From thermal management component 212 heat may be spread to one or more sections of second portion 204 of electronic device 200. For example, heat may be spread from a temple arm of an extended reality glasses to a front frame of extended reality glasses, or vice versa.

Figure 2C:
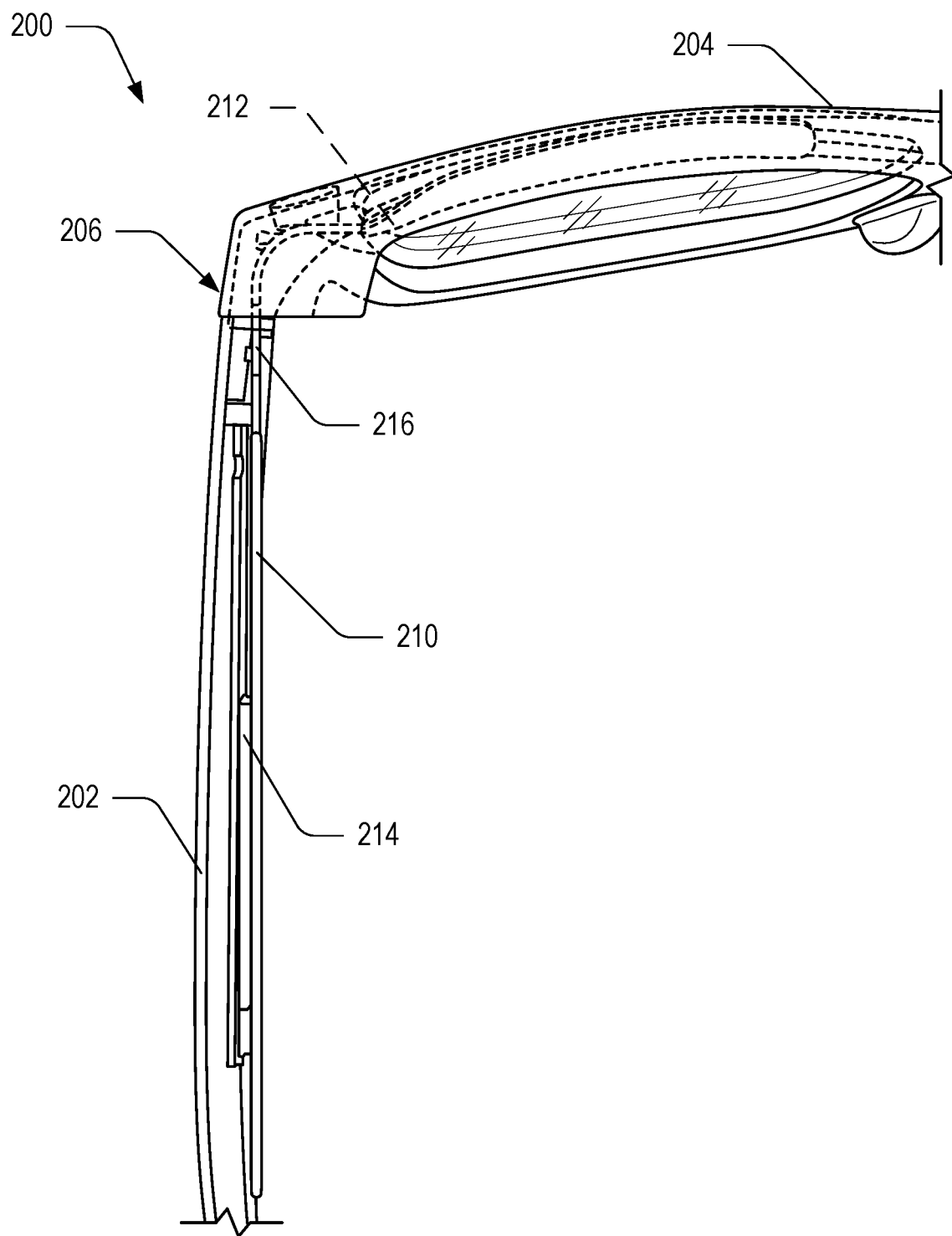

In examples, as shown in FIG. 2C, thermal system 208, including first and second thermal management components 210 and 212 and living hinge 216 may be provided inside an outer frame of electronic device 200. In examples, electronic device 200 may include an outer frame 218. In examples, outer frame 218 may include a mechanical articulation or coupler 206. In examples, mechanical articulation or coupler 206 may allow for at least partial rotation of the first hinged portion 202 about the X-axis of mechanical articulation 206 relative to second hinged portion 204 of the electronic device 200. As previously described, in examples, mechanical articulation 206 may include a passive coupler such as a barrel hinge structure. In examples, mechanical articulation 206 does not provide any pressure. In examples, mechanical articulation 206 may include a spring loaded or other pressure coupler.

In examples, living hinge 216 may extend along and/or through at least a portion of mechanical articulation 206. In examples, living hinge 216 may be configured to provide or enhance active functionality to mechanical articulation 206. In examples, living hinge 216 may be configured to bend in at least one direction. In examples, living hinge 216 may be configured to have a first function when in a bent state and a second function when in the non-bent or straightened state. In examples, through its bending and straightening living hinge 216 may impart or enhance active functionality to the mechanical articulation 206 by providing a force to operate the mechanical articulation 206.

In examples, living hinge 216 may be configured to impart a force and/or a resistance to either promote or prevent rotation about the X-axis of one or more hinged portions relative to the other hinged portion. In examples, living hinge 216 may be configured to favor or be biased toward a straightened state. In examples, living hinge 216 may be configured to have a curved cross-section configured to cause the living hinge 216 to snap from a bent state to a straighten state. In examples, a living hinge 216 may provide at least some resistance to bending. In examples, when in a bent state, a living hinge 216 may provide a force to achieve a straighten state.

In examples, in a bent state living hinge 216 may be configured to provide a force to rotate in at least one direction first hinged portion 202 relative to second hinged portion 204. For example, in the illustrated example glasses, living hinge 216 may be in a bent state when the temple arm or first hinged portion 202 of the glasses is generally and/or substantially parallel to the front frame or second hinged portion 204. In examples, while in the bent state living hinge 216 may be configured to exert a force on first hinge portion 202, the temple arm of the glasses, to rotate so that first hinged portion 202 becomes perpendicular or about perpendicular to the second hinged portion 204, i.e. the front frame of the glasses.

In examples, in a straightened state living hinge 216 may be configured to provide resistance from rotation about the X-axis in at least one direction of first hinged portion 202 relative to second hinged portion 204. For example, in the illustrated example glasses, living hinge 216 may be in a straightened state when the temple arm or first hinged portion 202 of the glasses is perpendicular or about perpendicular to the front frame or second hinged portion 204. In examples, while in the straightened state living hinge 216 may be configured to exert a resistance force on first hinge portion 202, the temple arm of the glasses, to prevent rotation so that first hinged portion 202 remains perpendicular or about perpendicular to the second hinged portion 204, i.e. the front frame of the glasses.

Figure 2D:
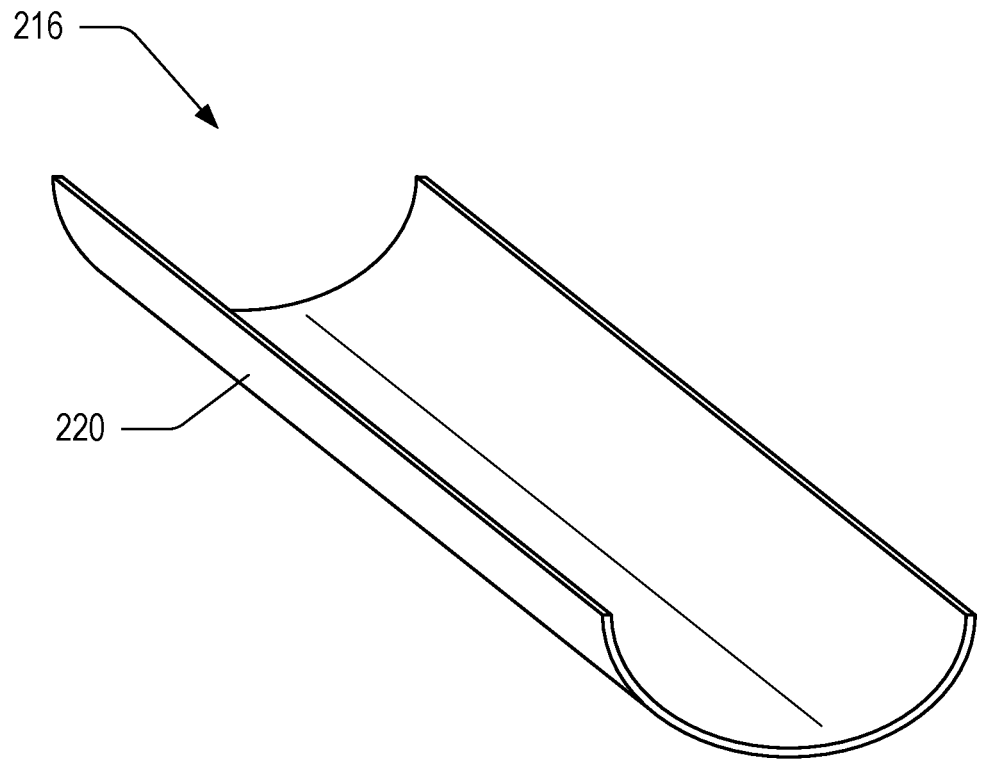
Figure 2E:
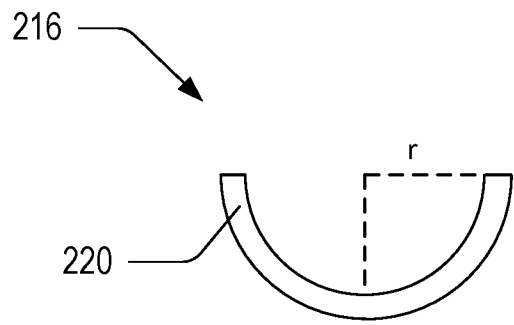

As shown in FIGS. 2D and 2E, a living hinge 216 may include a curved cross-section. FIG. 2D is a perspective view, and FIG. 2E is a front view from an end configured to be bonded to a thermal management component. In examples, a living hinge 216 may include a strip of material. In examples, a living hinge 216 may include a strip of material 220 having a curved cross-section, i.e. a curved shape across its width. For purposes of this disclosure, the width of a living hinge refers to the dimension extending between opposite sides of the living hinge that are perpendicular to the two ends of the living hinge configured to be bonded to thermal management components. In examples, the curvature of the width of a living hinge 216 may have a radius r that is about 4 to 5 times greater than the thickness of the living hinge 216. In examples, the radius of curvature may range from about 0.8 mm to 2.5 mm In examples, the curvature of the living hinge is configured to cause the living hinge 216 to snap to and/or favor or be biased toward a straightened state.

In examples, a living hinge 216 with a curved cross-sectional profile may be manufactured by stamping, molding, for example metal injection molding, or any other metal working technique.

In examples a living hinge 216 may be bonded to a thermal management component by any available means. In examples, the bonding may include a high K polymer, such as an epoxy. In examples, the epoxy may be cured to bond the living hinge to at least a portion of a thermal management component. In examples, the bonding may include ultrasonic bonding. In examples, the bonding may include solder and/or brazing. In examples, soldering and/or brazing may include a metal or metal alloy. In examples, the bonding may include a mechanical means, such as a fastener. In examples, a fastener may be a clamp, a screw, a bolt, a bracket, or any like structure and any combination thereof. Any combination of these bonding methods may also be employed. In examples, at least a portion of living hinge 216 may overlap at least a portion of a thermal management component when bonded together. In examples, the overlap may extend about 1.5 mm to 3 mm, for example about 2 mm.

Figure 2F:
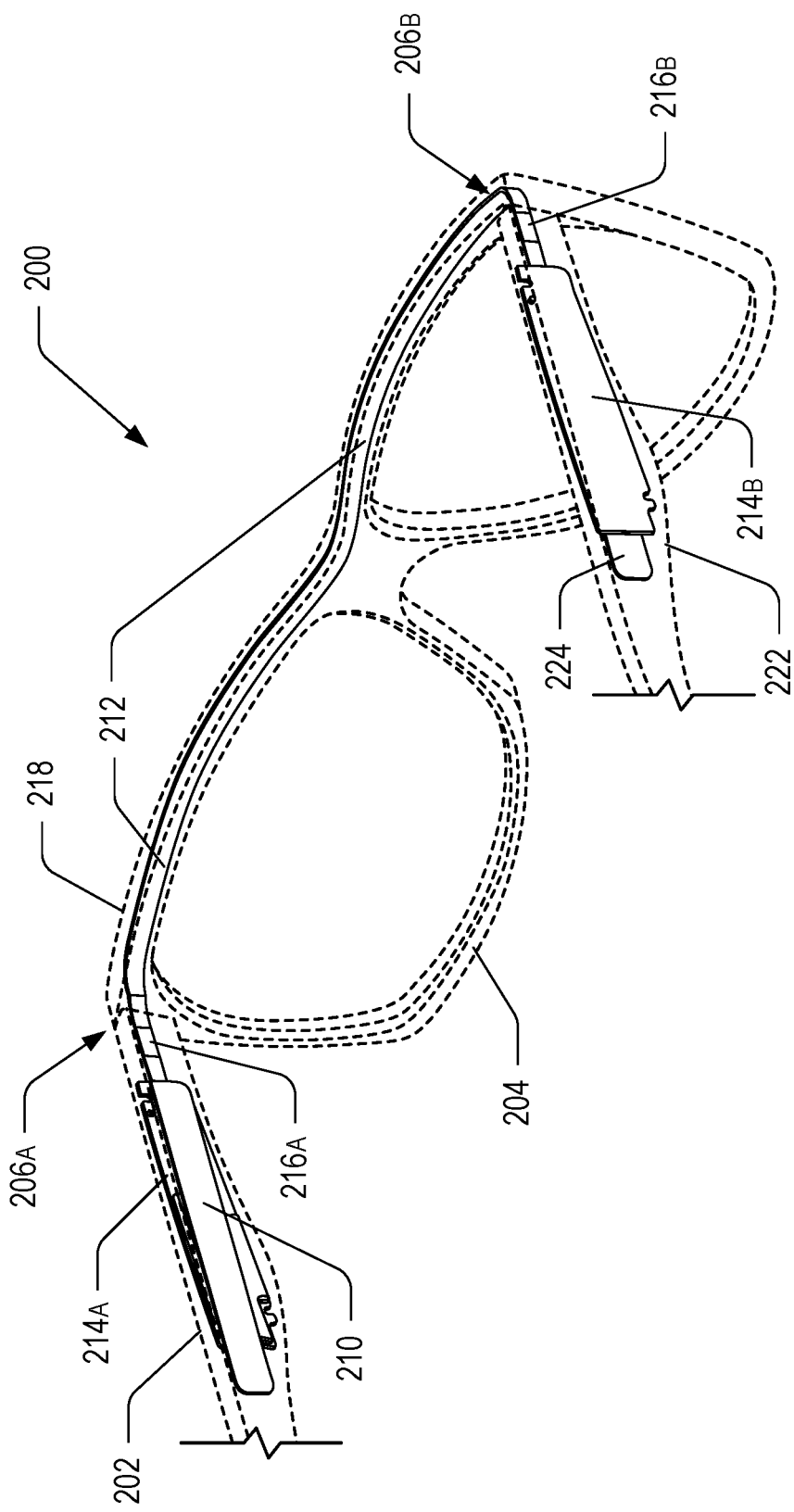

In examples, as shown in FIG. 2F, thermal system 208 may include two or more thermal management components connected serially via one or more living hinges 216 (e.g., 216a, 216b, etc.) In examples, thermal system 208 may extend from a first hinged portion 202 of electronic device 200, to a second hinged portion 204, and to a third hinged portion 222. For example, as illustrated, a first thermal management component 210 may be provided in a first hinged portion 202, a first living hinge 216a may be bonded at respective opposite ends to the first thermal management component 210 and to a second thermal management component 212 located in a second hinged portion 204 of electronic device 200. In examples, the second thermal management component 212 may extend across a full length of the second hinged portion 204. In examples, the second thermal management component 212 may be connected in series with one or more additional thermal management components together extending across the length of second hinged portion 204. In examples, the second thermal management component 212 and/or an additional thermal management component located in second hinged portion 204 and serially connected to the second thermal management component 212 may be bonded to a first end of second living hinge 216b. In examples, second living hinge 216b may be bonded, at an opposite second end, to at third thermal management component 224 located at a third hinged portion 222. In examples, as illustrated, the electronic device 200 may be a pair of extended reality glasses where the first hinged portion 202 and the third hinged portion 222 are temple arms and the second hinged portion 204 is the front frame. Other electronic devices having hinged portions may similarly be implemented with fewer or more hinged portions. For example, other electronic device having hinged portions may be a laptop with a hinge between a screen and a keyboard or a wrist wearable device having a hinge between a strap or band and a watch face. Other like devices may also be implemented. In examples, as previously described, the electronic device 200 may include an outer frame 218 that includes a mechanical articulation 206a connecting the first hinged portion 202 to the second hinged portion 204, and a mechanical articulation 206b connecting the second hinged portion 204 to the third hinged portion 222. In examples, each mechanical articulation 206a and 206b may each independently include a coupler that is passive, pressurized, and/or spring loaded. In examples, each mechanical articulation 206a and 206b may each independently include a barrel hinge coupler. In examples, living hinges 216a and 216b may extend across the respective mechanical articulations 206a and 206b. One or more electronic structures 214 (e.g., 214a, 214b, etc.) may be located at one or more hinged portions of electric device 200.

In examples, one or more of the first, second, and third thermal management components may be thermally coupled to an electronic structure. In examples, a method of transferring and/or spreading heat or thermal energy from a first portion of the electronic device to another may include transferring heat or thermal energy from one or more first electronic structures in one portion of the electronic device to a first thermal management component thermally coupled to the one or more first electronic structures, transferring heat or thermal energy from that first thermal management component to one or more other thermal management components by transferring heat or thermal energy at least through one or more living hinges 216, and transferring and/or spreading heat or thermal energy from the one or more other thermal management components to one or more other portions of the electronic device including a frame and/or other second electronic structures of the electronic device that are thermally coupled to the one or more other thermal management components. In examples, the transfer of an electrical signal may be carried out in the same manner as heat or thermal energy. In examples, a living hinge may be electrically conductive. In examples, a thermal management component may be electrically conductive. In examples, a living hinge may be electrically coupled to an electrical structure.

FIGS. 3A-3F illustrate examples of complementary and/or mating thermal interface components in a thermal system of an electronic device. In examples, a pair of complementary and/or mating thermal interface components may be configured to come and be pressed together in a cam action.

Figure 3A:
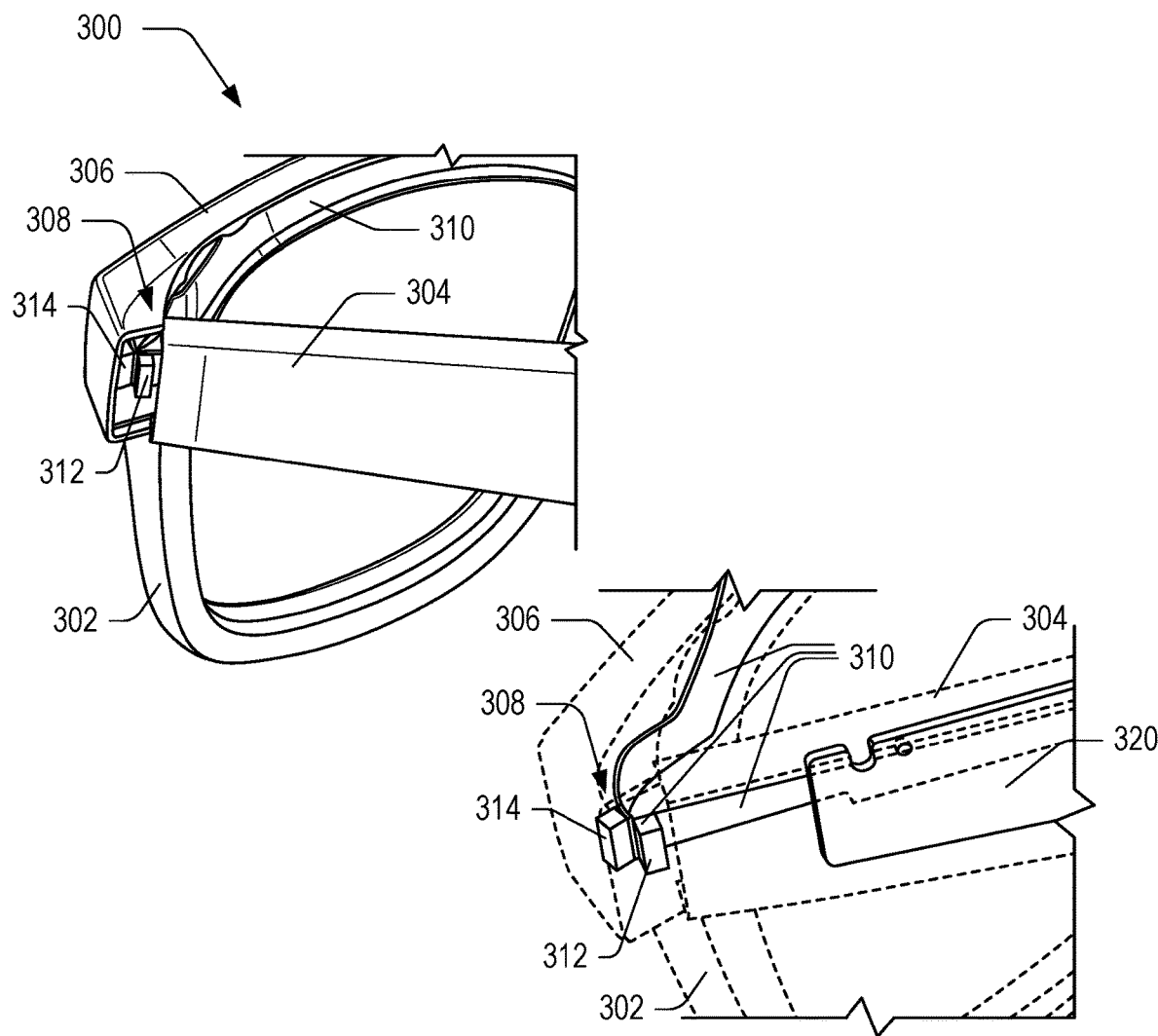
FIGS. 3A-3F illustrate examples of thermal interface components in a thermal system of an electronic device.
Figure 3B:
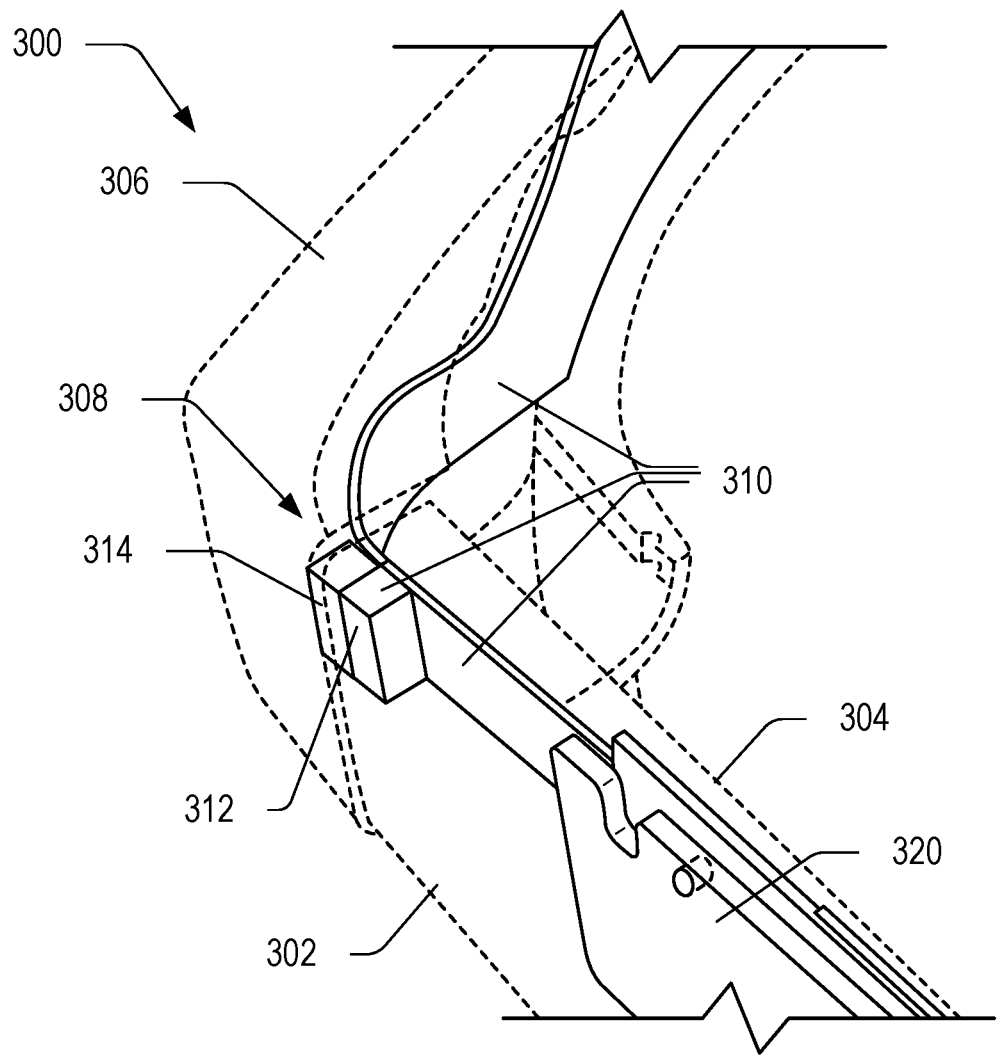
Figure 3C:
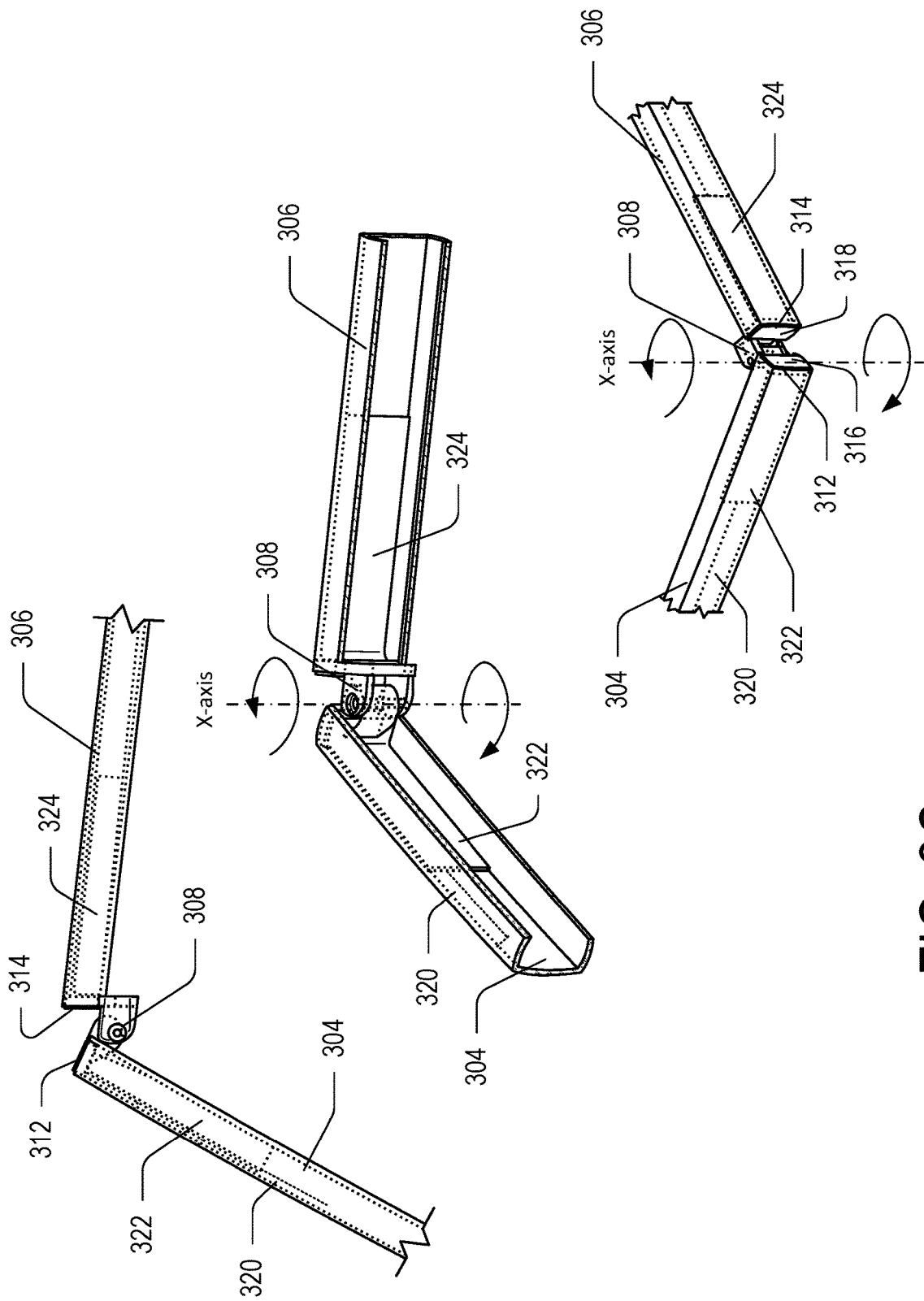

In examples, as shown in FIGS. 3A and 3B, an electronic device 300 may include an outer frame 302 as previously described having at least a first hinged portion 304 and a second hinged portion 306 coupled together at a mechanical articulation 308. In examples, electronic device 300 may include a thermal system 310. In examples, thermal system 310 may extend from one hinged portion to another one or more hinged portions. FIGS. 3A and 3B illustrate perspective views of a first and second hinged portions including a first and second thermal interface components bonded at least to respective thermal management components. FIG. 3A illustrates perspective views of the hinged portions positioned about a mechanical articulation such that the thermal interface components are spaced apart. FIG. 3B illustrates perspective views of the hinged portions positioned about a mechanical articulation such that the thermal interface components are in physical contact with each other.

In examples, the thermal system 310 may include thermal interface components 312 and 314. In examples, a thermal interface component is provided in one hinged portion and another thermal interface component is provided in another hinged portion. In examples, the two thermal interface components are provided in respective hinged portions of an electronic device so as to come into contact with each other when the two hinged portions are rotated or swung relative each other in at least one direction.

For example, as illustration of FIGS. 3A and 3B, a first thermal interface component 312 may be provided in first hinged portion 304 and second thermal interface component 314 may be provided in second hinged portion 306. In examples, the first thermal interface component 312 may be provided at an end portion or edge of the first hinged portion 304 such that at least a surface 316 of first thermal interface component 312 is exposed. In examples, a second thermal interface component 314 may be provided at an end portion or edge of the second hinged portion 306 such that at least a surface 318 of the second thermal interface component 314 is exposed. In examples, as the first hinged portion 304 and second hinged portion 306 are rotated relative each other in at least one direction about an X-axis of a mechanical articulation 308, an exposed surface 316 of the first thermal interface component 312 may come into contact with exposed surface 318 of the second thermal interface component 314. In examples, as the first hinged portion 304 and second hinged portion 306 are rotated relative each other about an X-axis of a mechanical articulation 308 in an opposite direction to the previously described, first thermal interface component 312 and second thermal interface component 318 may be physically displaced from each other.

In examples, a thermal interface component may include a thermally conductive, and optionally, electrically conductive material. In examples, a thermal interface component may include a thermal interface material. In examples, a thermal interface component may include a metal, polymer, or combination thereof. In examples, each thermal interface component may independently include a metal such as indium, tin, copper, aluminum, magnesium, nickel, stainless steel, or any combination thereof. In examples, one thermal interface component may include a high or low durometer material or high or low hardness material. In examples, one thermal interface component may include a higher or lower durometer or hardness material than the material of the other thermal interface component. In examples, a material used for the first and second thermal interface components 312 and 314 may be selected based on the amount of compressive force the thermal interface components may experience when contacting each other. In examples, a higher durometer or hardness material may be used in cases where the contact pressure between the two thermal interface components is higher, while a lower durometer or hardness material may be used in cases where the contact presser between the thermal interface components is lower.

In examples, the thermal interface components may include any suitable structure capable of transferring heat, for example, blocks, pads, fingers, or like structures. In examples, a thermal interface component may be formed by any suitable process such as metal working process, computerized manufacturing process (e.g. CNC machining), forging, casting, or like processes.

In examples, a thermal interface component may have a thickness ranging from 0.5 mm to 2 mm, for example, for example, 0.5 mm, 0.75 mm, 1 mm, 1.25 mm, 1.50 mm, 1.75 mm, or 2 mm In examples, each thermal interface component may have a thickness within a range defined by any of two of these examples. In examples, the contact area or area of the exposed surface of a thermal interface component may be about 50 mm$^2$. In examples, the contact area or area of the exposed surface of a thermal interface component may be within the range of 40 to 60 mm$^2$, for example, 45 to 55 mm$^2$, 45 to 50 mm$^2$, 50 to 55 mm$^2$, 55 to 60 mm$^2$.

In examples, a complementary pair of thermal interface components may exhibit suitable mechanical tolerance to ensure tight fit and preload when pressed together. In examples, the exposed surface or contact surface of a thermal interface component may be lubricious to prevent stiction or locking with another thermal interface component. In examples, the exposed surface or contact surface of a thermal interface component may be exposed to a thermal interface material treatment to reduce interface thermal resistance.

In examples, the exposed surface or contact surface of a thermal interface component may include a thermally conductive coating to prevent oxidation, corrosion, and/or to impart a certain color or design. For purposes of this disclosure, an "exposed surface" or "contact surface" of a thermal interface component as previously described may include a surface of the thermal interface component with a thermally conductive coating thereon.

In examples, the exposed surface or contact surface of each thermal interface component may independently include a surface finish. For examples, the exposed surface or contact surface may be anodized, etched, passivated, or any combination thereof. In examples, the surface finish of a first thermal interface component may be the same or different from the surface finish of a second thermal interface component that is configured to contact the first thermal interface component.

In examples, the thermal interface components may be configured to include respective male-female complementary exposed surfaces or contact surfaces. This may allow for better contact between the two surfaces when the two thermal interface components are pressed together. In examples, an exposed surface or contact surface may include a surface finish and/or a surface topography including one or more surface features 326. In examples, surface features may include fingers, teeth, cones, pyramids, hexagons, or like structures. In examples, a first thermal interface component may include a first surface finish and/or one or more first surface features 326a. In examples, the first interface component may be associated with a mechanical articulation. For example, the first interface component may be provided at a first hinged portion of the electronic device. In examples, a second interface component may include a second surface finish and/or one or more second surface features 326b. In examples, the second interface component may be associated with the same mechanical articulation. For example, the second thermal interface component may be provided at a second hinged portion of the electronic device. In examples, the first and second hinged portions of the electronic device may be coupled by the mechanical articulation. In examples, the one or more first surface features and the one or more second surface features may be complementary to each other. In examples, the first interface component and the second interface component may be configured to mate when pressed together. In examples, the one or more first surface features and the one or more second surface features may be configured to mate when the first thermal interface component and the second thermal interface component are pressed together. For example, as shown in FIG. 3E, the surface features 326 may include ridges and/or recesses that can be configured to mate wherein the ridges of one surface may fit within the recesses of the other surface. Other arrangements may also be implemented.

In examples, not shown, one thermal interface component may include curved protrusions. In examples, a curved protrusion may be a curved finger or finger like extension. In examples, curved protrusions, for example curved fingers, may include a coating and/or surface features on the surface thereof. In examples, the curved protrusion, e.g. curved fingers, of the one thermal interface component may be configured to engage into a receptable with complementary features provided in the second thermal interface component. A receptacle may include an opening or recess in the second thermal interface component. In examples, a receptacle may include a coating and/or surface features on the surface thereof that may be configured to complement, accommodate and/or negotiate any coating and/or surface feature provided on the curved protrusion of the other thermal interface component.

In examples, the thermal interface components may be configured to have the same or different surface profiles. In examples, as illustrated in FIG. 3F, one thermal interface component may include one or more surface features 326 while the other thermal interface component may include a low durometer or hardness material, a surface coating, and/or a surface lining 328 configured to accommodate and/or negotiate the surface features of the other thermal interface component when the two thermal interface component are pressed together without becoming permanently imprinted or indented. As used herein "low durometer" or "low hardness" is used to refer to properties of materials that are suitable for use when the pressure is about 50 psi or lower and "high durometer" or "high hardness" is used to refer to materials for use when the pressure is about 100 psi or higher, for example, higher than 200 psi, or higher than 500 psi. In some examples, one or more guide features 330 such as one or more guide pins, keys, or dimple may be used to align the thermal interface components and/or the surface features of the thermal interface components to ensure proper mating.

In examples, the thermal interface components may be configured to withstand and/or operate without incurring unwanted impressions at varying contact pressures. In examples, the contact pressure between the two blocks may be about 50 psi. In examples, the contact pressure between the two blocks may be range from about 40 psi to about 900 psi. In examples, the contact pressure may be below 40 psi, for example 10-40 psi. In examples, the contact pressure may be greater than 900 psi.

In examples, each thermal interface component may be bonded to a respective thermal management component. Any suitable means to bond thermal interface component to a thermal management component may be utilized. In examples, similar methods as previously described for living hinge bonding to a thermal management component may be used. In examples, a thermal interface component may be bonded to a thermal management component by welding, thermo-press, high K polymer, such as an epoxy, ultrasonic bonding, brazing and other like methods. In examples, a thermal interface component may be bonded to a thermal management component by injection molding or thermal forming Any combination of these bonding methods may also be employed.

In examples, a thermal interface component may be bonded to at least a portion of outer frame 302 of electronic device 300. In examples, a thermal interface component may be bonded to at least a portion of an electronic structure 320. In examples, electronic structure 320 may include a printed circuit board (PCB), a processor, memory, a I/O device, a communication interface, or any like device. In examples, a thermal interface component may be bonded to outer frame 302 of electronic device 300 and/or to an electronic structure 320 in the same or similar manner as described for bonding thermal interface component to a thermal managing component.

In examples, as shown, a first hinged portion 304 and second hinged portion 306 may be coupled at a mechanical articulation 308. In examples, mechanical articulation 308 may be a pressure coupler. In examples, mechanical articulation 308 may include a spring hinge or spring-loaded hinge, a pressure hinge, or any combination thereof. In examples, mechanical articulation 308 may be barrel hinge coupler. In examples, pressure at the mechanical articulation may be provided by means other than or in addition to the coupler. In examples, at least one hinged portion may be configured to experience a rotational force about rotational X-axis of the mechanical articulation by means other the coupler.

In examples, a mechanical articulation 308 may cause first and second thermal interface components to press against each other when the first and second hinged portions of electronic device 300 has been rotated into at least one direction. In examples, the amount of pressure caused by the mechanical articulation 308 may be in the range of 10 psi to over 900 psi. In examples, the contact pressure between the two thermal interface components caused by mechanical articulation 308 may be about 50 psi. In examples, the contact pressure between the two thermal interface components caused by mechanical articulation 308 may be range from about 40 psi to about 900 psi. In examples, the contact pressure between thermal interface components caused by mechanical articulation 308 may be below 40 psi, for example 10 to 40 psi. In examples, the contact pressure between thermal interface components caused by mechanical articulation 308 may be greater than 900 psi.

In examples, the contact pressure between thermal interface components may be generated or enhanced by something other than mechanical articulation 308. In examples, a force may be applied to one or more hinged portions to force rotation about the X-axis of mechanical articulation 308 in a given direction. In examples, mechanical articulation 308 may be supplemented by a living hinge 216 as previously described. Any combination of these may also be present.

In examples, a thermal system 310 may include a first thermal management component 322 located in the first hinged portion 304. In examples, first thermal management component 322 may be bonded to a first thermal interface component 312. In examples, thermal system 310 may include a second thermal management component 324 located in the second hinged portion 306. In examples, the second thermal management component 324 may be bonded to a second thermal interface component 314. In examples, the first thermal management component 322 and second thermal management component 324 may independently be selected from any thermal management component as previously described. In examples, a thermal management component may include a thermally conductive material, a vapor chamber, a heat pipe or any combination thereof. In examples, thermal management components for thermal system 310 may be the same as previously described generally and with reference to a living hinge and FIGS. 2A-2F. In examples, a thermal management component may include a flex circuit and/or flex circuit material. In some examples, a thermal management component may additionally or alternatively include and/or be coupled to one or more other thermal management features (e.g., heatsinks, fins, radiators, fans, compressors, etc.) which may further increase the ability of the thermal management component to remove heat from components of the electronic device.

In examples, at least one of the first or second thermal management components 322 and 324 may be thermally coupled to an electronic structure 320. In examples, the electronic structure 320 may be a PCB. In examples, the first or second thermal management component may be coupled to a heatsink or other thermal dissipation component, or other electronics of the electronic device. In examples, a method of transferring and/or spreading heat or thermal energy from one portion of the electronic device 300 to another may include transferring heat or thermal energy produced by electronic structure 320 to a thermal management component and then spread across different portions of electronic device 300 by thermal system 310. In examples, heat may be spread from the first thermal management component 322 to the second thermal management component 324 when the first thermal interface component 312 contacts the second thermal interface component 314. In examples, when first thermal interface component 312 is in physical contact with the second thermal interface component 314 a thermally conductive path is formed between them and consequently between the first thermal management component 322 and the second thermal management component 324. In examples, the thermally conductive path between the first and second thermal management components 322 and 324 is disrupted or broken when the first and second thermal interface components 312 and 314 are spaced apart from each other. In this manner, in examples, it is possible to provide a thermally conductive path only when the first hinged portion 304 and the second hinged portion 306 are arranged in a predetermined manner.

In examples, a method of transferring and/or spreading heat or thermal energy across different portions of an electronic device may include forming a thermally conductive path (or thermal flow path) by rotating at least one hinged portion relative another hinged portions to bring a first thermal interface component into contact with a second thermal interface component. In examples, the method may include disrupting the transferring and/or spreading of heat or thermal energy across different portion of an electronic device by disrupting or breaking a thermally conductive path (or thermal flow path) by rotating at least one hinged portion relative another hinged portions to spacer apart a first thermal interface component from a second thermal interface component. In examples, a method of transferring an electrical signal may be performed in the same manner as transferring heat or thermal energy. In examples, the first and second thermal interface components may be electrically conductive. In examples, the first and second thermal management components may be electrically conductive. In examples, the first and second thermal interface components may be electrically coupled to an electronic structure of the electronic device. In examples, by contacting the two thermal interface components an electrical path is formed, while by separating or spacing apart the two thermal interface components, an electrical path is interrupted.

In examples, rotation of the first hinged portion 304 and second hinged portion 306 relative each other about mechanical articulation rotational X-axis may cause disruption and/or establishment of a thermally conductive path between the first thermal management component 322 and the second thermal management component 324.

Figure 3D:
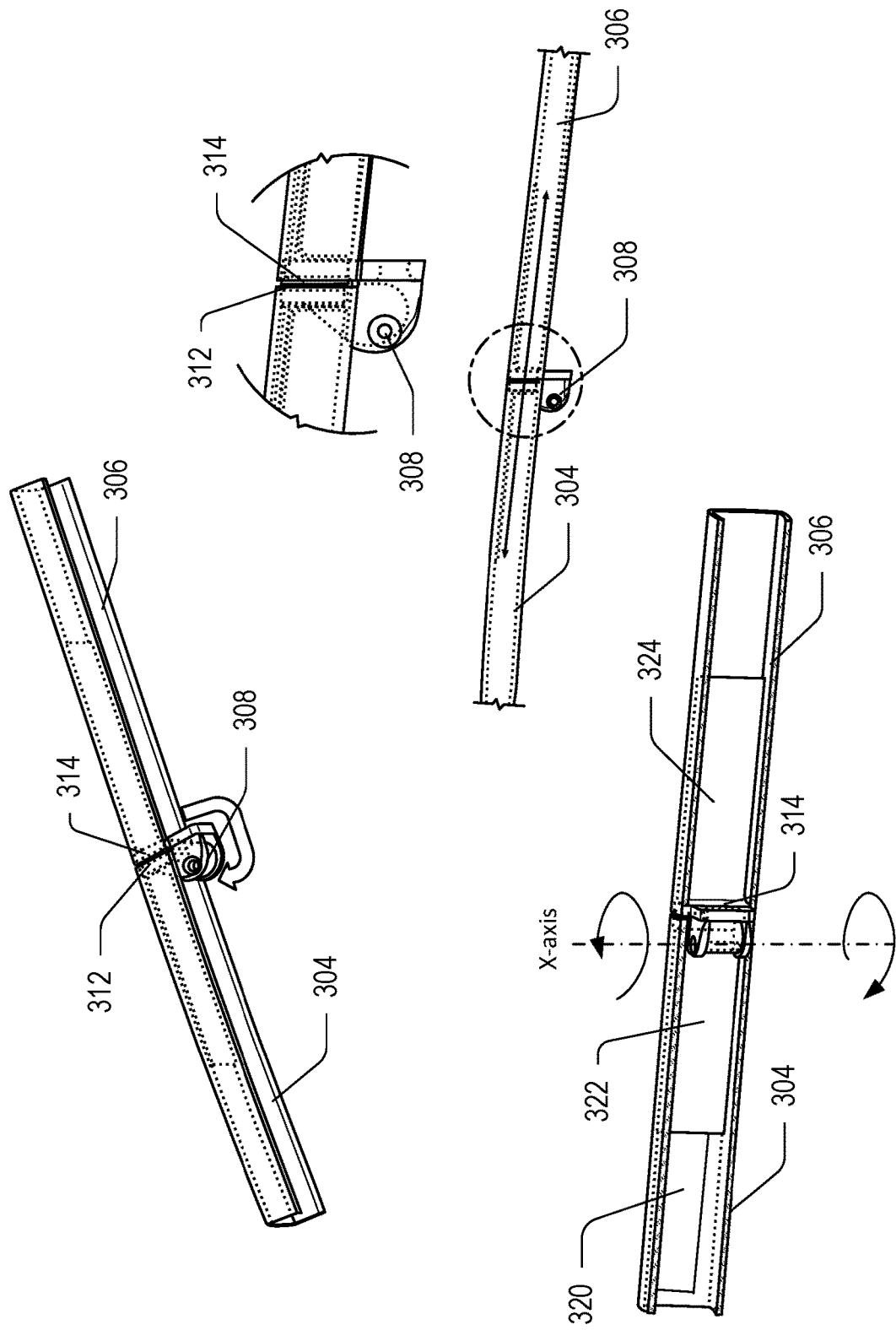
Figure 3E:
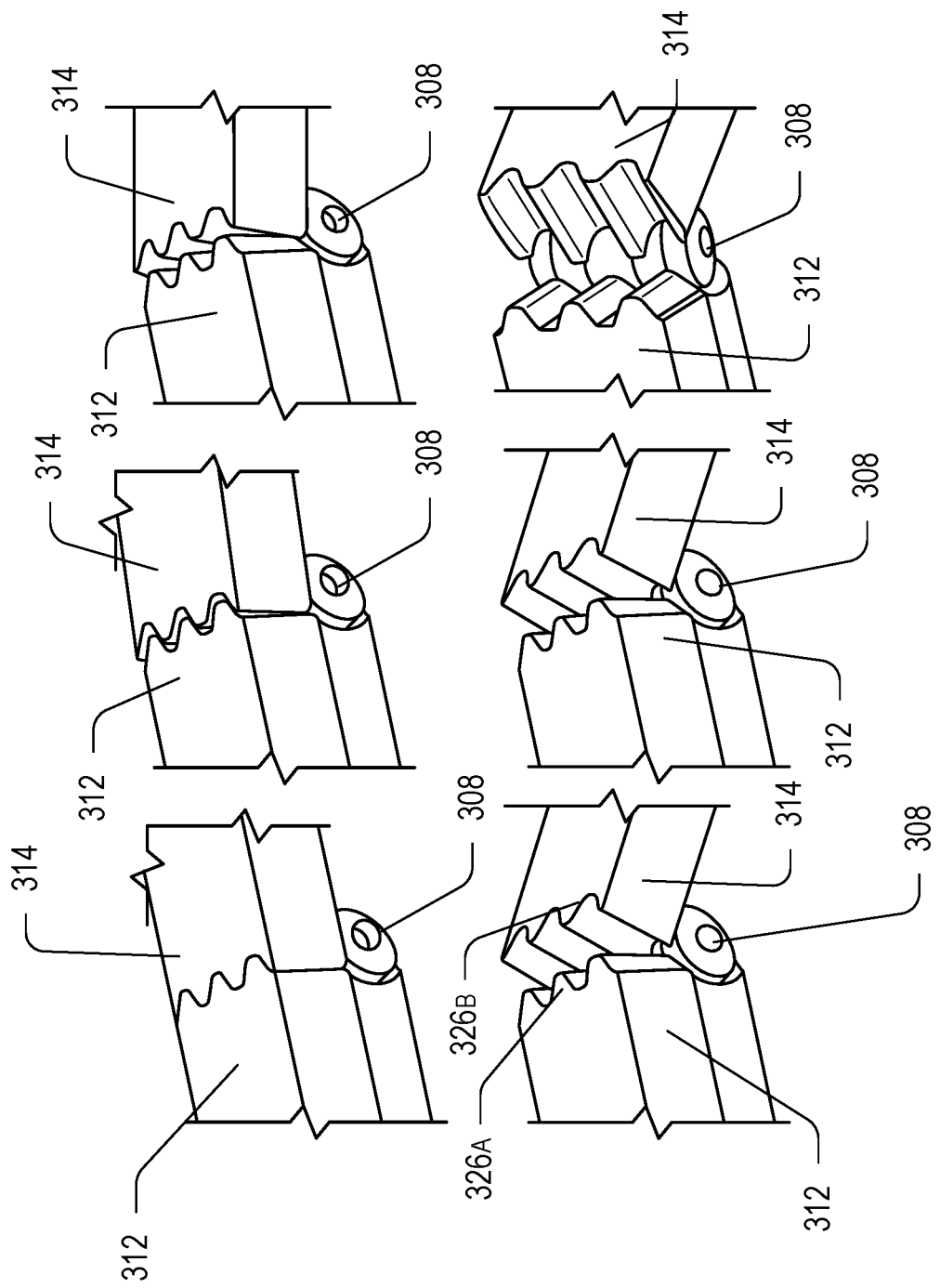
Figure 3F:
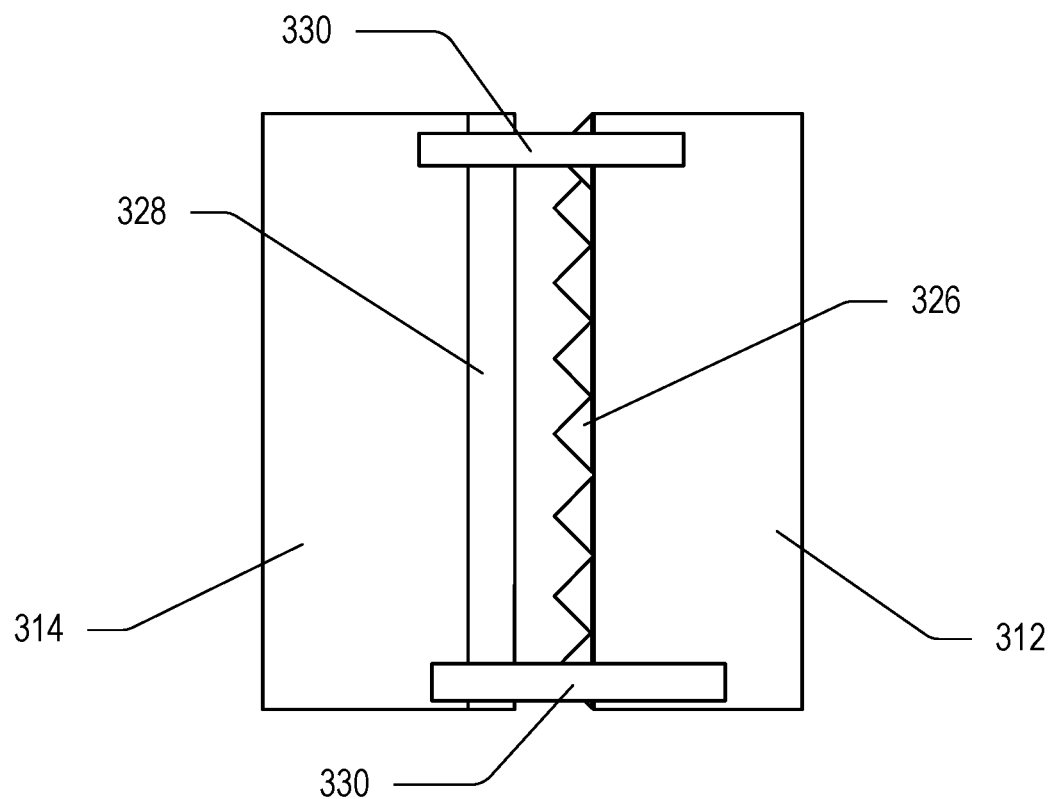

FIGS. 3D and 3E illustrate examples of joints used in the electronic device 300. In examples, the electronic device is a pair of extended reality glasses, however, other electronic devices may be similarly be implemented. For example, other electronic device having hinged portions may be a laptop with a hinge between a screen and a keyboard or a wrist wearable device having a hinge between a strap or band and a watch face. Other like devices may also be implemented. In examples, the electronic device 300 may include a temple arm as the first hinged portion 304 and a front frame as the second hinged portion 306.

In examples, where electronic device 300 is an extended reality glasses, the first hinged portion 304 may be a temple arm and the second hinged portion 306 may be a front frame. Accordingly, in examples, as the temple arm is swung so at to be perpendicular or about perpendicular to the front frame, the first thermal interface component 312 may be configured to come into contact with second thermal interface component 314. In examples, as the temple arm is swung so as to become generally, or substantially parallel to the front frame, the first thermal interface component 312 and the second thermal interface component 314 may be spaced apart from each other.

Although illustrated as having thermal interface components at only one mechanical articulation, this is only an example. In examples, an electronic device 300 may include more than one mechanical articulation and a set of thermal interface components at one or more mechanical articulations. For example, in a pair of extended reality glasses, a pair of thermal interface components may be provided at each mechanical articulation coupling a temple arm to a front frame.

In examples, when the extended reality glasses may be configured such that when they are worn by a user, an additional force may be applied to the temple arms to increase a pressure at the mechanical articulation 308 so that increased contact pressure is exerted between the first and second thermal interface component. For example, an extended reality glasses may be configured such that an end of each temple arm opposite a mechanical articulation 308 may be push outward when fitting the head of a user between them. Such outward force may then increase the contact pressure between the thermal interface components at each side of where the front frame is coupled to the respective temple arm.

Figure 4:
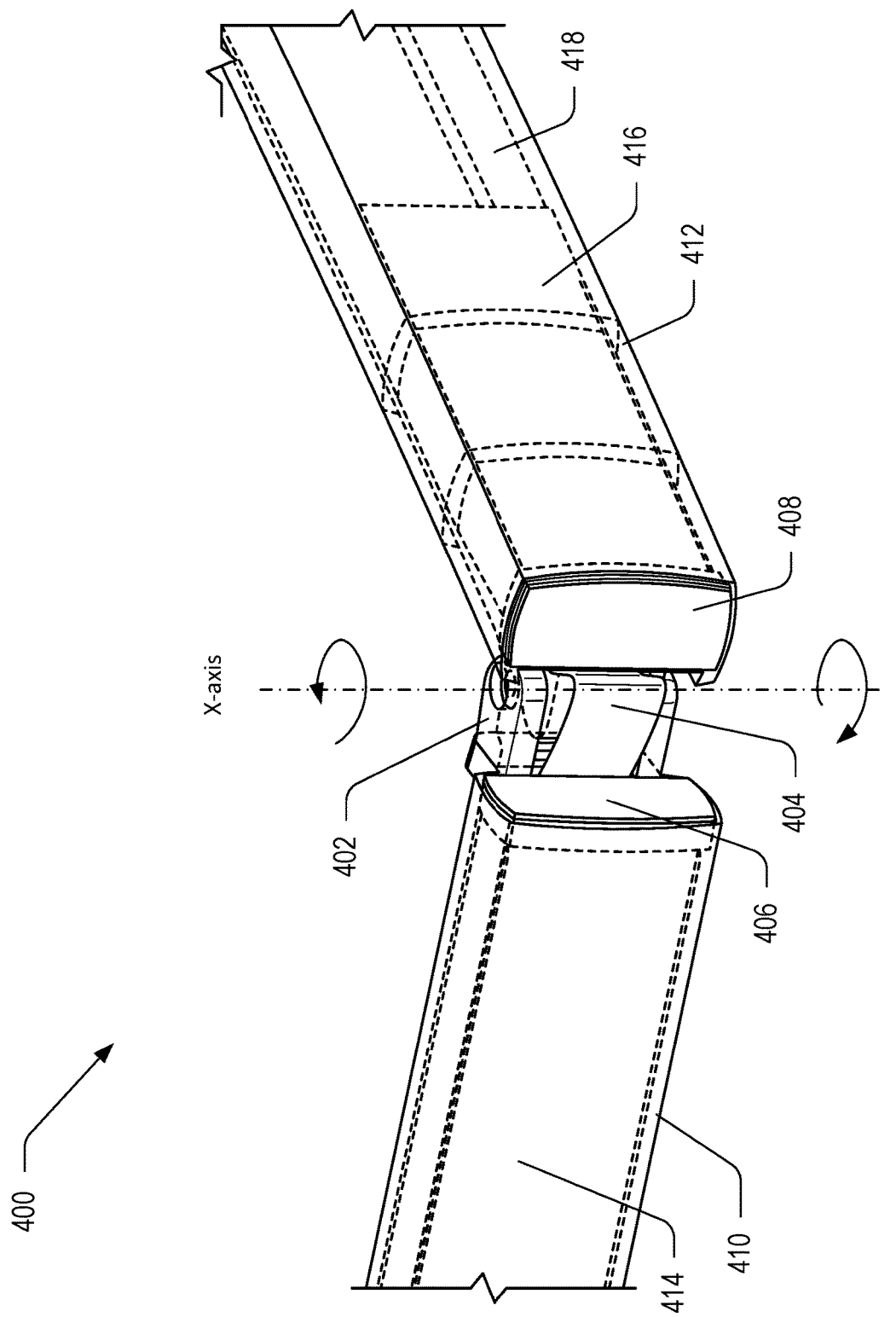
FIG. 4 illustrates a portion of an example of an electronic device that may include a mechanical articulation and a combination of a living hinge and thermal interface components.

In examples, as partially shown in FIG. 4, an electronic device 400 may include a mechanical articulation 402 having a living hinge 404 as previously described with reference to FIGS. 2A-2F, in combination with thermal interface components 406 and 408 as described with reference to FIGS. 3A-3E. In examples, the mechanical articulation 402 may couple a first hinged portion 410 to a second hinged portion 412. In examples, first and second hinged portions 410 and 412 may include respective first and second thermal management components 414 and 416. In examples, one or more electronic structures 418 is in one or more hinged portions. In examples, the living hinge 404 may cause a contact pressure to be exerted between thermal interface components 406 and 408 when the living hinge 404 is in a straighten state. In examples, the living hinge 404 may enhance a contact pressure to be exerted between thermal interface components 406 and 408 when the living hinge 404 is in a straighten state. In examples, the contact pressure between thermal interface components 406 and 408 may be caused and/or enhanced by a pressurized mechanical articulation 402, and/or by an additional force applied to one or both hinged portions of electronic device 400.

In examples, a method of transferring and/or spreading heat across different portions of an electronic device may include transferring heat or thermal energy via at least a living hinge and enhancing heat or thermal energy transfer by bringing into contact a first thermal interface with a second thermal interface both located at the mechanical articulation in which the living hinge is also located. In examples, a method may decrease transfer of heat by separating and/or spacing apart a first thermal interface component from a second thermal interface component while maintaining at least some heat transfer via the living hinge.

In examples, method of transferring an electrical signal from one portion of the electronic device to another may be performed in the same manner as described for transferring and/or spreading heat or thermal energy. In examples, electrical signal may be transferred via a living hinge, via two or more thermal interface components, or a combination thereof. In examples, thermal interface components may be electrically conductive. In examples, a living hinge may be electrically conductive. In examples, conduction of electrical and thermal energy may be performed simultaneously and/or independently.

Although the discussion above sets forth example implementations of the described techniques and structural features, other architectures may be used to implement the described functionality and are intended to be within the scope of this disclosure. Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the structural features and/or methodological acts may be rearranged and/or combined with each other and/or other structural features and/or methodological acts. In various examples, one or more of the structural features and/or methodological acts may be omitted.

What is claimed is:

1. A system to conduct thermal energy between two hinged portions of an extended-reality headset device comprising:
    a living hinge extending from a face front portion of the extended-reality headset device to a temple arm of the extended-reality headset device;
    a first thermal management component connected to a first end of the living hinge; and
    a second thermal management component connected to a second end, opposite the first end, of the living hinge, wherein:
        the living hinge comprises a material that is thermally conductive, and
        the living hinge is configured to operate in a bent state and a non-bent state,
        the bent state is configured such that a major length of the temple arm is substantially parallel to the face front portion, and
        while in the non-bent state, the living hinge is configured to conduct thermal energy generated from use of the extended-reality headset device from the first thermal management component to the second thermal management component.

2. The system of claim 1, wherein each of the first thermal management component and the second thermal management component comprise a heat pipe or a vapor chamber.

3. The system of claim 1, wherein the first thermal management component and the second thermal management component are connected to the living hinge via welding, thermosonic bonding, brazing, mechanical fastener, adhesive, or any combination thereof.

4. The system of claim 1, wherein the living hinge has a curved cross-sectional shape.

5. The system of claim 1, wherein the living hinge is electrically conductive.

6. The system of claim 1, wherein the living hinge is biased toward the non-bent state.

7. The system to conduct thermal energy between two hinged portions of an extended-reality headset of claim 1, wherein:
    while in the non-bent state, the living hinge is configured to conduct thermal energy generated from use of the extended-reality headset device from the first thermal management component to the second thermal management component at a first thermal-energy transfer rate, and
    while in the bent state, the living hinge is configured to conduct thermal energy generated from use of the extended-reality headset device from the first thermal management component to the second thermal management component at a second thermal-energy transfer rate that is lower than the first thermal-energy transfer rate.

8. A method of transferring thermal energy between two hinged portions of an extended-reality headset device comprising:
    providing an electronic device comprising a face front portion of the extended-reality headset device comprising a first thermal management component and a temple arm of the extended-reality headset device comprising a second thermal management component, the face front portion and the temple arm being coupled by a mechanical articulation and a thermally conductive living hinge being bonded to the first thermal management component at one end and to the second thermal management component at an opposite, second end, wherein the thermally conductive living hinge is configured to operate in a bent state and a non-bent state, the bent state is configured such that a major length of the temple arm is substantially parallel to the face front portion, and while in the non-bent state, the thermally conductive living hinge is configured to conduct thermal energy generated from use of the extended-reality headset device from the first thermal management component to the second thermal management component;

transferring thermal energy from an electronic structure provided in the face front portion to the first thermal management component;

transferring the thermal energy from the first thermal management component to the thermally conductive living hinge;

transferring the thermal energy from the thermally conductive living hinge to the second thermal management component; and transferring the thermal energy from the second thermal management component to the temple arm.

9. The method of transferring thermal energy between two hinged portions of an extended-reality headset of claim 8, wherein:

while in the non-bent state, the thermally conductive living hinge is configured to conduct thermal energy generated from use of the extended-reality headset device from the first thermal management component to the second thermal management component at a first thermal-energy transfer rate, and while in the bent state, the thermally conductive living hinge is configured to conduct thermal energy generated from use of the extended-reality headset device from the first thermal management component to the second thermal management component at a second thermal-energy transfer rate that is lower than the first thermal-energy transfer rate.

10. An extended-reality headset device comprising:

a face front portion comprising a first thermal management component;

a temple arm comprising a second thermal management component;

a mechanical articulation coupling a first hinged portion to a second hinged portion; and a living hinge bonded to the first thermal management component and the second thermal management component and extending through the mechanical articulation, wherein:

the living hinge comprises a material that is thermally conductive; and the living hinge is configured to operate in a bent state and a non-bent state, the bent state is configured such that a major length of the temple arm is substantially parallel to the face front portion, and while in the non-bent state, the living hinge is configured to conduct thermal energy generated from use of the extended-reality headset device from the first thermal management component to the second thermal management component.

11. The extended-reality headset device of claim 10, wherein the living hinge comprises an electrically conductive material.

12. The extended-reality headset device of claim 10, wherein the living hinge is bonded to the first thermal management component and to the second thermal management component via welding, thermosonic bonding, brazing, mechanical fastener, adhesive, or any combination thereof.

13. The extended-reality headset device of claim 10, wherein the living hinge comprises a curved cross-section.

14. The extended-reality headset device of claim 10, wherein the living hinge is configured to be biased toward the straighten non-bent state.

15. The extended-reality headset device of claim 10, wherein the first thermal management component and the second thermal management component may each independently comprise a vapor chamber, a heat pipe, a strip of thermally conductive material, or any combination thereof.

16. The extended-reality headset device of claim 10, wherein at least one of the first thermal management component and the second thermal management component are constructed of a material associated with a flex circuit.

17. The extended-reality headset device of claim 10, wherein the mechanical articulation comprises a barrel hinge.

18. The extended-reality headset device of claim 10, further comprising a first thermal interface component in the face front portion and a second thermal interface component in the temple arm, the first thermal interface component and the second thermal interface component arranged such that they come into physical contact with each other when the living hinge is in the non-bent state and are spaced apart when the living hinge is in the bent state.

19. The extended-reality headset device of claim 10, wherein the extended-reality headset device is an augmented-reality headset.

20. An extended-reality headset device of claim 9, wherein:

while in the non-bent state, the living hinge is configured to conduct thermal energy generated from use of the extended-reality headset device from the first thermal management component to the second thermal management component at a first thermal-energy transfer rate, and while in the bent state, the living hinge is configured to conduct thermal energy generated from use of the extended-reality headset device from the first thermal management component to the second thermal management component at a second thermal-energy transfer rate that is lower than the first thermal-energy transfer rate.

* * * * *